US012604486B2

(12) United States Patent
Park et al.

(10) Patent No.: US 12,604,486 B2
(45) Date of Patent: Apr. 14, 2026

(54) SEMICONDUCTOR DEVICE

(71) Applicant: Samsung Electronics Co., Ltd., Suwon-si (KR)

(72) Inventors: Young-Lim Park, Suwon-si (KR); Woo Seop Lim, Suwon-si (KR); Ji Min Chae, Suwon-si (KR); Chang Mu An, Suwon-si (KR); Jae Soon Lim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 420 days.

(21) Appl. No.: 18/182,507

(22) Filed: Mar. 13, 2023

(65) Prior Publication Data

US 2023/0402503 A1 Dec. 14, 2023

(30) Foreign Application Priority Data

May 23, 2022 (KR) ........................ 10-2022-0063108

(51) Int. Cl.
H10D 1/00 (2025.01)
H10B 12/00 (2023.01)
H10D 1/68 (2025.01)

(52) U.S. Cl.
CPC ........... H10D 1/042 (2025.01); H10B 12/033 (2023.02); H10B 12/315 (2023.02); H10D 1/716 (2025.01)

(58) Field of Classification Search
CPC .... H10B 12/033; H10B 12/315; H10D 1/042; H10D 1/696; H10D 1/716
See application file for complete search history.

(56) References Cited

U.S. PATENT DOCUMENTS 10,964,614 B2 3/2021 Lee et al.
11,133,314 B2 9/2021 Jung et al.
11,233,118 B2 1/2022 Park et al.
11,251,260 B2 2/2022 Lee et al.
(Continued)

FOREIGN PATENT DOCUMENTS

KR 10-2022-0036825 A 3/2022
TW 202213804 A 4/2022
TW 202220143 A 5/2022

OTHER PUBLICATIONS

Taiwanese Office Action dated Dec. 14, 2023 issued in Taiwanese Patent Application No. 112117958.
(Continued)

*Primary Examiner* — Edward Chin
(74) *Attorney, Agent, or Firm* — Fish & Richardson P.C.

(57) ABSTRACT

Disclosed is a semiconductor device. The semiconductor device includes a lower electrode disposed on a substrate; a first lower interfacial film disposed on the lower electrode; a dielectric film disposed on the first lower interfacial film; a first upper interfacial film disposed on the dielectric film; and an upper electrode disposed on the first upper interfacial film, wherein each of the first lower interfacial film and the first upper interfacial film is a conductive single film, and the first lower interfacial film and the first upper interfacial film include the same metal element, wherein electronegativity of the metal element included in each of the first lower interfacial film and the first upper interfacial film is greater than electronegativity of a metal element included in the dielectric film.

18 Claims, 21 Drawing Sheets

(56)     References Cited

U.S. PATENT DOCUMENTS

| 2016/0133691 | A1 | 5/2016 | Phatak et al. |
| 2017/0018604 | A1 | 1/2017 | Ahn et al. |
| 2021/0183718 | A1 | 6/2021 | Lee et al. |
| 2021/0408222 | A1 | 12/2021 | Suh et al. |
| 2022/0084935 | A1* | 3/2022 | Lin ...................... H01L 21/022 |

OTHER PUBLICATIONS

Office Action in Korean Appln. No. 10-2022-0063108, mailed on Jan. 26, 2026, 13 pages (with English translation).

* cited by examiner

142P

112

141P

240

111

130

120

110

115

100

DR2

DR1

142

240

141

130
120
110
115

100

DR2
DR1

C-C                                    D-D

DR2                                    DR2
⊗ → D1                          DR3 ← ⊗
DR3                                    DR1

SEMICONDUCTOR DEVICE

CROSS-REFERENCE TO RELATED APPLICATION

This application claims priority from Korean Patent Application No. 10-2022-0063108 filed on May 23, 2022, in the Korean Intellectual Property Office, and all the benefits accruing therefrom under 35 U.S.C. 119, the contents of which in its entirety are herein incorporated by reference.

BACKGROUND

Various example embodiments relate to a semiconductor device.

In recent years, as a semiconductor device has large-capacity and becomes highly integrated, a design rule thereof continues to decrease. This trend is applied to DRAM (dynamic random-access memory) as one of memory semiconductor devices. In order for the DRAM device to operate, capacitance of a particular (e.g. a pre-defined) level or greater is required or expected for each cell.

Increases in the capacitance may increase an amount of charge stored in a capacitor, thereby improving refresh characteristics of the semiconductor device. The improved refresh characteristics of the semiconductor device may improve a yield of the semiconductor device.

In order to increase the capacitance, a method of using a dielectric film having a high dielectric constant for the capacitor and/or of increasing a contact area between a lower electrode of the capacitor and the dielectric film is being studied.

SUMMARY

Various example embodiments provide a semiconductor device with improved product reliability.

Purposes of example embodiments are not limited to the above-mentioned purpose. Other purposes and advantages according to various example embodiments that are not mentioned may be understood based on following descriptions, and/or may be more clearly understood based on various example embodiments according to the present disclosure. Further, it will be easily understood that the purposes and advantages according to example embodiments may be realized as shown in the claims and combinations thereof.

According to some example embodiments, a semiconductor device comprises a substrate, a lower electrode on the substrate, a first lower interfacial film on the lower electrode, a dielectric film on the first lower interfacial film, a first upper interfacial film on the dielectric film, and an upper electrode on the first upper interfacial film. Each of the first lower interfacial film and the first upper interfacial film is a conductive single film, and the first lower interfacial film and the first upper interfacial film include a same metal element. An electronegativity of the metal element included in each of the first lower interfacial film and the first upper interfacial film is greater than an electronegativity of a metal element included in the dielectric film.

Alternatively or additionally, according to some example embodiments a semiconductor device comprises a substrate, a lower electrode on the substrate, a first lower interfacial film on the lower electrode and including a nitride of a first metal element, a dielectric film on the first lower interfacial film, a first upper interfacial film on the dielectric film and including a nitride of the first metal element, and an upper electrode on the first upper interfacial film. The electronegativity of the first metal element is greater than the electronegativity of a metal element included in the dielectric film.

Alternatively or additionally, according to some example embodiments a semiconductor device comprises a substrate, the substrate defining a trench, a gate electrode filling a portion of the trench, a buried contact on at least one side of the gate electrode and connected to the substrate, a landing pad on the buried contact, and a capacitor connected to the landing pad. The capacitor includes a lower electrode disposed on the substrate, a lower interfacial film on the lower electrode, a dielectric film on the lower interfacial film, an upper interfacial film on the dielectric film, and an upper electrode disposed on the upper interfacial film. The upper and lower electrodes include a same conductive material. The lower interfacial film is a single film and the upper interfacial film is a single film, and the lower interfacial film and the upper interfacial film include a same metal element. The electronegativity of the metal element included in each of the lower interfacial film and the upper interfacial film is greater than the electronegativity of a metal element included in the dielectric film.

Other details of the present disclosure are included in following detailed descriptions and drawings.

BRIEF DESCRIPTION OF DRAWINGS

The above and other aspects and features of the present disclosure will become more apparent by describing in detail illustrative various example embodiments thereof with reference to the attached drawings, in which.

DETAILED DESCRIPTION

Figure 1:
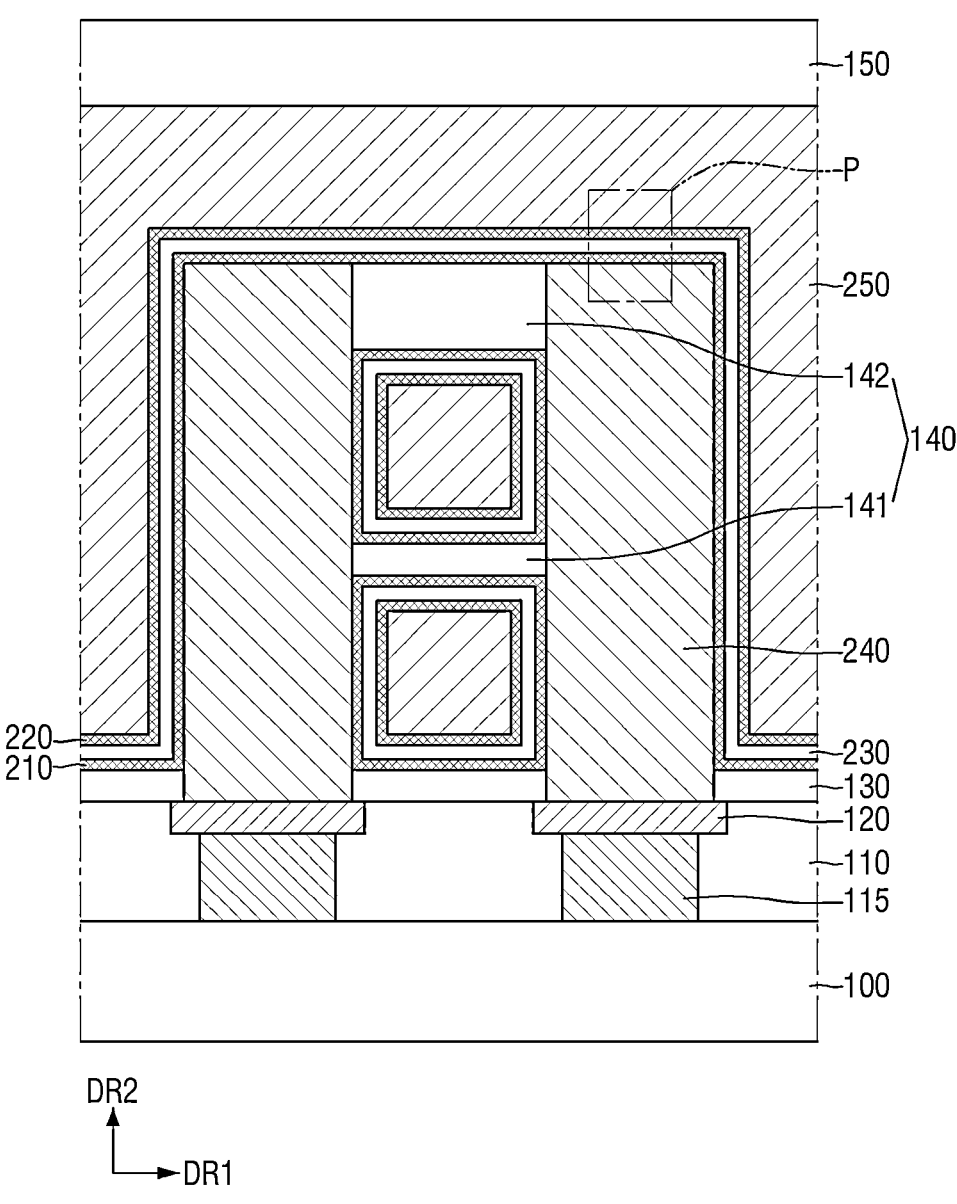
FIG. 1 is a diagram for illustrating a semiconductor device according to various example embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of example embodiments, numerous specific details are set forth in order to provide a thorough understanding of various example embodiments. However, it will be understood that the present disclosure may be practiced without these specific details. Examples of various embodiments are illustrated and described further below. It will be understood that the description herein is not intended to limit the claims to the specifically described example embodiments described. On the contrary, it is intended to cover alternatives, modifications, and equivalents as may be included within the idea and scope of the present disclosure as defined by the appended claims.

A shape, a size, a ratio, an angle, a number, etc. disclosed in the drawings for illustrating various example embodiments are illustrative, and example embodiments are not limited thereto. The same reference numerals refer to the same elements herein. Furthermore, in the following detailed description, numerous specific details are set forth in order to provide a thorough understanding of the present disclosure. However, it will be understood that the example embodiments may be practiced without these specific details.

The terminology used herein is for the purpose of describing particular example embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the idea and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time or at least partially at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. Example embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction DR1" or "first direction X", "second direction DR2" or "second direction Y", and "third direction DR3" or "third direction Z" should not be interpreted only to have a geometric relationship in which the first direction, the second direction, and the third direction are perpendicular to each other. The "first direction DR1", "second direction DR2" and "third direction DR3" may be interpreted to have a broader direction within a range in which components herein may work functionally.

Hereinafter, example embodiments according to the technical idea of the present disclosure will be described with reference to the accompanying drawings.

Figure 2:
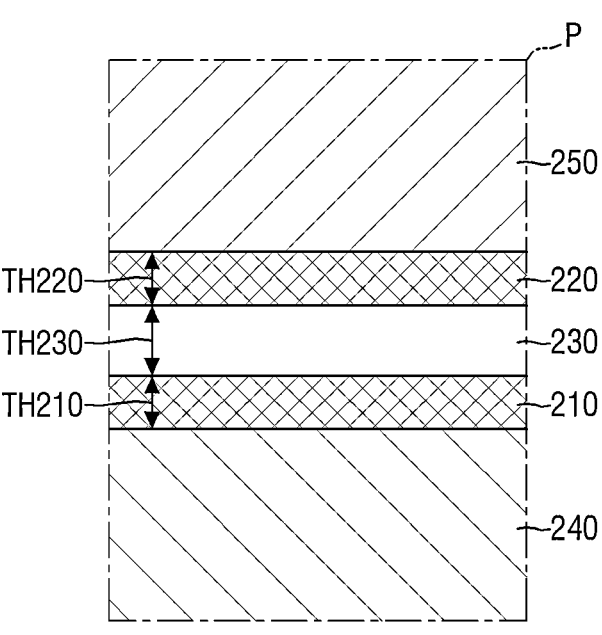
FIG. 2 is an enlarged view of a portion P of FIG. 1.

FIG. 1 is a diagram for illustrating a semiconductor device according to various example embodiments. FIG. 2 is an enlarged view of a portion P of FIG. 1.

Referring to FIG. 1 and FIG. 2, the semiconductor device may include a substrate 100, a first landing pad 120, a lower interfacial film 210, an upper interfacial film 220, a capacitor dielectric film 230, a lower electrode 240, and an upper electrode 250.

The first landing pad 120 may be disposed on the substrate 100. The first landing pad 120 may be connected to the substrate 100. The first landing pad 120 may be electrically connected to a conductive area formed on or within the substrate 100.

The first landing pad 120 may be connected to the substrate 100 via or through a first storage contact 115. The first landing pad 120 may be disposed on the first storage contact 115.

A first interlayer insulating film 110 may be disposed on the substrate 100. The first storage contact 115 and the first landing pad 120 may be disposed in the first interlayer insulating film 110 on the substrate 100.

The substrate 100 may be made of (e.g. may include) bulk silicon or (SOI) silicon-on-insulator. Alternatively or additionally, the substrate 100 may be embodied as one or more of a silicon substrate, or may include a material other than silicon, such as silicon germanium, SGOI (silicon germanium on insulator), indium antimonide, a lead telluride compound, indium arsenide, indium phosphide, gallium arsenide or gallium antimonide. may be included. However, example embodiments are not limited thereto.

The first interlayer insulating film 110 may include, for example, silicon oxide, silicon nitride, silicon oxynitride (SiON), silicon oxycarbonitride (SiOCN), or combinations thereof.

The first storage contact 115 may include, for example, at least one of a semiconductor material (such as polysilicon) doped with impurities, a conductive silicide compound, a conductive metal nitride, and a metal.

The first landing pad 120 may include, for example, at least one of a semiconductor material doped with impurities, a conductive silicide compound, a conductive metal nitride, and a metal.

In the semiconductor device according to various example embodiments, the first landing pad 120 may include tungsten (W).

An etch stop layer 130 may be disposed on the first interlayer insulating film 110. The etch stop layer 130 may expose at least a portion of the first landing pad 120. In one example, the etch stop layer 130 may be disposed on the first landing pad 120. The etch stop layer 130 may include a lower electrode hole exposing at least a portion of the first landing pad 120.

The etch stop layer 130 may include, for example, at least one of silicon nitride (SiN), silicon carbonitride (SiCN), silicon boron nitride (SiBN), silicon carbonoxide (SiCO), silicon oxynitride (SiON), silicon oxide (SiO), and silicon oxycarbonitride (SiOCN). For example, silicon carbide (SiCO) is composed of silicon (Si), carbon (C) and oxygen (O), wherein a ratio between contents of silicon (Si), carbon (C) and oxygen (O) is not limited to a specific value.

A lower electrode 240 may be disposed on the first landing pad 120. The lower electrode 240 is connected to the first landing pad 120.

The lower electrode 240 may extend in an elongated manner in a second direction DR2 corresponding to a thickness direction of the substrate 100. A length or height by which the lower electrode 240 extends in the second direction DR2 is greater than a dimension in the first direction DR1 of the lower electrode 240. The lower electrode 240 may have a pillar shape, for example, e.g. a cylindrical or prismatic shape.

In this regard, the second direction DR2 may correspond to a direction parallel to a thickness direction of the substrate 100. A first direction DR1 may correspond to a direction which intersects the second direction DR2 and is parallel to a top face of the substrate 100 or a top face of the first interlayer insulating film 110.

The lower electrode 240 may be disposed on a side face of the etch stop layer 130. For example, a portion of the sidewall of the lower electrode 240 may contact the etch stop layer 130. The lower electrode 240 may extend through the etch stop layer 130 and be connected to the first landing pad 120.

The lower electrode 240 may include, for example, one or more of a doped semiconductor material such as doped polysilicon, a conductive metal nitride such as one or more of titanium nitride, tantalum nitride, niobium nitride or tungsten nitride, etc., a metal such as one or more of ruthenium, iridium, titanium or tantalum, etc., or a conductive metal oxide such as one or more of iridium oxide or niobium oxide, etc. However, example embodiments are not limited thereto. In the semiconductor device according to various example embodiments, the lower electrode 240 may include titanium nitride (TiN). Alternatively or additionally, in the semiconductor device according to various example embodiments, the lower electrode 240 may include niobium nitride (NbN).

A supporter 140 may include a lower supporter pattern 141 and an upper supporter pattern 142.

The lower supporter pattern 141 may be disposed on the etch stop layer 130. The lower supporter pattern 141 is spaced apart from the etch stop layer 130 in the second direction DR2.

The lower supporter pattern 141 may contact the lower electrode 240. The lower supporter pattern 141 may contact a portion of a sidewall of the lower electrode 240.

The lower supporter pattern 141 may connect lower electrodes 240 adjacent to each other in the first direction DR1 to each other.

The upper supporter pattern 142 may be disposed on the lower supporter pattern 141. The upper supporter pattern 142 is spaced apart from the lower supporter pattern 141 in the second direction DR2. The upper supporter pattern 142 may contact the lower electrode 240. The upper supporter pattern 142 may be in contact with a portion of a sidewall of the lower electrode 240.

In FIG. 1, it is illustrated that two lower electrodes 240 are connected to each other via the lower supporter pattern 141 and the upper supporter pattern 142. However, this is only for convenience of illustration. However, example embodiments are not limited thereto.

A top face of the upper supporter pattern 142 may be coplanar with a top face of the lower electrode 240. However, example embodiments are not limited thereto. For example, the top face of the lower electrode 240 may protrude beyond the top face of the upper supporter pattern 142 in the second direction DR2 away from the substrate 100. In following descriptions, an example in which the top face of the upper supporter pattern 142 is coplanar with the top face of the lower electrode 240 is described.

Each of the lower supporter pattern 141 and the upper supporter pattern 142 may include, for example, at least one of silicon nitride (SiN), silicon carbonitride (SiCN), silicon boron nitride (SiBN), silicon carbonoxide (SiCO), silicon oxynitride (SiON), silicon oxide (SiO), and silicon oxycarbonitride (SiOCN).

In the semiconductor device according to various example embodiments, each of the lower supporter pattern 141 and the upper supporter pattern 142 may include silicon carbonitride (SiCN) and/or silicon nitride (SiN).

In FIG. 1, it is illustrated that a thickness in the second direction DR2 of the lower supporter pattern 141 is smaller than a thickness in the second direction DR2 of the upper supporter pattern 142. However, example embodiments are not limited thereto. In another example, the thickness of the lower supporter pattern 141 in the second direction DR2 may be equal to the thickness of the upper supporter pattern 142 in the second direction DR2.

Unlike what is illustrated, the semiconductor device according to various example embodiments may include only one of the lower supporter pattern 141 and the upper supporter pattern 142. Alternatively or additionally, the semiconductor device according to various example embodiments may include an additional supporter pattern disposed between the etch stop layer 130 and the lower supporter pattern 141, or between the lower supporter pattern 141 and the upper supporter pattern 142.

The lower interfacial film 210 may be disposed along and on a top face of the etch stop layer 130, a surface of the lower electrode 240, a surface of the lower supporter pattern 141, and a surface of the upper supporter pattern 142. The lower interfacial film 210 may extend along profiles of the lower electrode 240, the upper supporter pattern 142, the lower supporter pattern 141 and the etch stop layer 130.

Since the lower supporter pattern 141 and the upper supporter pattern 142 are in contact with the lower electrode 240, the lower interfacial film 210 does not extend into a portion between the lower supporter pattern 141 and the lower electrode 240 and between the upper supporter pattern 142 and the lower electrode 240. Further, the lower interfacial film 210 does not extend into a portion between the etch stop layer 130 and the lower electrode 240.

A thickness of the lower interfacial film 210 may be less than a thickness of the capacitor dielectric film 230. For example, a thickness TH210 of the lower interfacial film 210 in the second direction DR2 may be less than a thickness TH230 of the capacitor dielectric film 230 in the second direction DR2. However, embodiments are not limited thereto. In another example, the thickness of the lower interfacial film 210 may be greater than the thickness of the capacitor dielectric film 230.

The lower interfacial film 210 may be embodied as a conductive single film, and may be conformal over the etch stop layer 130 and the lower electrode 240. The capacitor dielectric film 230 may be conformal over at least a portion of the lower interfacial film 210. The lower interfacial film 210 may include (e.g. may consist of) a metal element. Alternatively or additionally the lower interfacial film 210 may include metal oxide. Alternatively or additionally the lower interfacial film 210 may include metal nitride. Alternatively or additionally, the lower interfacial film 210 may include metal oxynitride.

For example, the lower interfacial film 210 may include one of (e.g. only one of or more than one of) titanium (Ti), vanadium (V), chromium (Cr), manganese (Mn), iron (Fe), cobalt (Co), nickel (Ni), copper (Cu), aluminum (Al), gallium (Ga), germanium (Ge), niobium (Nb), molybdenum (Mo), technetium (Tc), ruthenium (Ru), palladium (Pd), silver (Ag), cadmium (Cd), indium (In), tin (Sn), antimony (Sb), tantalum (Ta), tungsten (W), rhenium (Re), osmium (Os), iridium (Ir), platinum (Pt), gold (Au), mercury (Hg), lead (Pb), bismuth (Bi) and polonium (Po). However, example embodiments are not limited thereto. The lower interfacial film 210 may include at least one of oxide, nitride or oxynitride of one of the metals as listed above.

An electronegativity of the metal element included in the lower interfacial film 210 is greater than an electronegativity of the metal element included in the capacitor dielectric film 230. For example, when the capacitor dielectric film 230 includes hafnium (Hf), the lower interfacial film 210 may include niobium (Nb). For example, the capacitor dielectric film 230 may not include niobium (Nb), and/or the lower interfacial film 210 may not include hafnium (Hf). In this regard, hafnium (Hf) has an electronegativity of 1.3 and niobium (Nb) has an electronegativity of 1.6. In another example, when the capacitor dielectric film 230 includes zirconium (Zr), the lower interfacial film 210 may include tin (Sn). In this regard, the electronegativity of zirconium (Zr) is 1.33, and the electronegativity of niobium (Nb) is 1.6.

The upper interfacial film 220 may be disposed on the capacitor dielectric film 230, e.g. may be conformal to the capacitor dielectric film 230. The upper interfacial film 220 may extend along a profile of the capacitor dielectric film 230.

A thickness of the upper interfacial film 220 may be less than a thickness of the capacitor dielectric film 230. For example, a thickness TH220 of the upper interfacial film 220 in the second direction DR2 may be less than a thickness TH230 of the capacitor dielectric film 230 in the second direction DR2. However, example embodiments are not limited thereto. In another example, the thickness of the upper interfacial film 220 may be greater than the thickness of the capacitor dielectric film 230.

The thickness of the lower interfacial film 210 and the thickness of the upper interfacial film 220 may be equal to each other. For example, the thickness TH210 of the lower interfacial film 210 in the second direction DR2 and the thickness TH220 of the upper interfacial film 220 in the second direction DR2 may be equal to each other. However, example embodiments are not limited thereto. The thickness of the lower interfacial film 210 and the thickness of the upper interfacial film 220 may be different from each other (e.g., one may be greater than or less than another).

The upper interfacial film 220 may be embodied as a single conductive film. The upper interfacial film 220 may include a metal element (e.g. may include only one metal element). The upper interfacial film 220 may include metal oxide. The upper interfacial film 220 may include metal nitride. The upper interfacial film 220 may include metal oxynitride.

For example, the upper interfacial film 220 may include one of (e.g. only one of) titanium (Ti), vanadium (V), chromium (Cr), manganese (Mn), iron (Fe), cobalt (Co), nickel (Ni), copper (Cu), aluminum (Al), gallium (Ga), germanium (Ge), niobium (Nb), molybdenum (Mo), technetium (Tc), ruthenium (Ru), palladium (Pd), silver (Ag), cadmium (Cd), indium (In), tin (Sn), antimony (Sb), tantalum (Ta), tungsten (W), rhenium (Re), osmium (Os), iridium (Ir), platinum (Pt), gold (Au), mercury (Hg), lead (Pb), bismuth (Bi) and polonium (Po). However, example embodiments are not limited thereto. The upper interfacial film 220 may include oxide, nitride, or oxynitride of any one of the metals as listed above.

An electronegativity of the metal element included in the upper interfacial film 220 is greater than the electronegativity of the metal element included in the capacitor dielectric film 230.

The lower interfacial film 210 and the upper interfacial film 220 may include the same metal element, and may or may not include any other metal element. Each of the lower interfacial film 210 and the upper interfacial film 220 may include one of a nitride-based first metal element, an oxide-based first metal element, and an oxynitride-based first metal element. For example, when the lower interfacial film 210 is embodied as a single film including niobium, the upper interfacial film 220 may be embodied as a single film including niobium. There may or may not be other common metal elements between the lower interfacial film 210 and the upper interfacial film 220.

The lower interfacial film 210 and the upper interfacial film 220 may be made of different materials while including the same metal element. The lower interfacial film 210 and the upper interfacial film 220 may be embodied as an oxide film and a nitride film including the same metal element, respectively. For example, when the lower interfacial film 210 is embodied as a single film including niobium oxide, the upper interfacial film 220 may be embodied as a single film including niobium nitride. Alternatively, the lower interfacial film 210 and the upper interfacial film 220 may be embodied as a nitride film and an oxynitride film including the same metal element, respectively. For example, when the lower interfacial film 210 is embodied as a single film including niobium nitride, the upper interfacial film 220 may be embodied as a single film including niobium oxynitride.

The lower interfacial film 210 and the upper interfacial film 220 may be made of the same material including the same metal element. For example, both the lower interfacial film 210 and the upper interfacial film 220 may be respectively embodied as oxide films including niobium. Alternatively or additionally, both the lower interfacial film 210 and the upper interfacial film 220 may be respectively embodied as nitride films including niobium. Alternatively or additionally, both the lower interfacial film 210 and the upper interfacial film 220 may be respectively embodied as single films including niobium oxynitride.

When the lower interfacial film 210 and the upper interfacial film 220 are respectively films made of the same material, the phrase "same material" includes a case where types of elements thereof are the same as each other while contents of (e.g. stoichiometric ratios of) the elements thereof are different from each other. For example, $NbO$, $NbO_2$, and $Nb_2O_5$ may be construed as the same material.

The electronegativity of each of the metal element included in the lower interfacial film 210 and the metal element included in the upper interfacial film 220 is greater than the electronegativity of the metal element included in the capacitor dielectric film 230. In this regard, a difference between the electronegativity of the metal element included in each of the lower interfacial film 210 and the upper interfacial film 220 and the electronegativity of the metal element included in the capacitor dielectric film 230 may be greater than 0.05.

For example, when the capacitor dielectric film 230 includes zirconium (Zr) having electronegativity of 1.33, each of the lower interfacial film 210 and the upper interfacial film 220 may include tin (Sn) having electronegativity of 1.96. In another example, when the capacitor dielectric film 230 includes hafnium (Hf) having electronegativity of 1.3, each of the lower interfacial film 210 and the upper interfacial film 220 may include niobium (Nb) having electronegativity of 1.6.

The lower interfacial film 210 which includes the metal element with electronegativity greater by a difference greater than 0.05 than that of the capacitor dielectric film 230 may decrease a valence band offset between valence bands of the lower electrode 240 and the capacitor dielectric film 230, and may increase a conduction band offset between conduction bands thereof. The upper interfacial film 220 which includes the metal element with electronegativity greater by a difference greater than 0.05 than that of the capacitor dielectric film 230 may decrease a valence band offset between valence bands of the upper electrode 250 and the capacitor dielectric film 230, and may increase a conduction band offset between conduction bands thereof.

The capacitor dielectric film 230 may be disposed on the lower interfacial film 210. The capacitor dielectric film 230 may extend along a profile of the lower interfacial film 210

The capacitor dielectric film 230 may not come into contact with (e.g. may not be shorted with) the lower electrode 240. The capacitor dielectric film 230 may be spaced apart from the lower electrode 240 while the lower interfacial film 210 is interposed therebetween. Further, the capacitor dielectric film 230 may not directly contact the lower supporter pattern 141 and the upper supporter pattern 142. The capacitor dielectric film 230 may be spaced apart from the lower supporter pattern 141 and the upper supporter pattern 142 while the lower interfacial film 210 may be interposed therebetween.

The capacitor dielectric film 230 may not directly contact the upper electrode 250. The capacitor dielectric film 230 may be spaced apart from the upper electrode 250 while the upper interfacial film 220 is interposed therebetween.

The capacitor dielectric film 230 may include, for example, one of (e.g. one or more of) silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. Although it is illustrated that the capacitor dielectric film 230 is embodied as a single film, this is only for convenience of illustration. Example embodiments are not limited thereto.

In the semiconductor device according to various example embodiments, the capacitor dielectric film 230 may include a stack structure in which a film made of zirconium oxide, a film made of aluminum oxide, and a film made of zirconium oxide are sequentially stacked.

In the semiconductor device according to various example embodiments, the capacitor dielectric film 230 may include a dielectric film including hafnium (Hf).

In the semiconductor device according to various example embodiments, the capacitor dielectric film 230 may have a stack structure of a ferroelectric material film and a paraelectric material film.

The ferroelectric material film may have ferroelectric properties. The ferroelectric material film may have a thickness sized such that the film may have ferroelectric properties. A thickness range of the ferroelectric material film with ferroelectric properties may vary depending on a type of the ferroelectric material.

For example, the ferroelectric material film may include monometal oxide. The ferroelectric material film may include a monometal oxide film. In this regard, the monometal oxide may be a binary compound composed of one metal and oxygen (e.g. MO). The ferroelectric material film including the monometal oxide may have an orthorhombic crystal system.

In one example, the metal included in the monometal oxide film may be hafnium (Hf). The monometal oxide film may be a hafnium oxide film (HfO). In this regard, the hafnium oxide film may have a chemical formula that satisfies a stoichiometry or may have a chemical formula that does not satisfy the stoichiometry.

In another example, the metal included in the monometal oxide film may be one of rare earth metals belonging to the lanthanoids. The monometal oxide film may be a rare earth metal oxide film belonging to the lanthanoids. In this regard, the rare earth metal oxide film belonging to the lanthanoids may have a chemical formula that satisfies the stoichiometry or may have a chemical formula that does not satisfy the stoichiometry.

The ferroelectric material film may be undoped, or may further include dopants doped in the monometal oxide film. A doping concentration may vary depending on a type of dopant. However, the doping concentration of the dopant included in the ferroelectric material film may be 10% or less.

In one example, when the monometal oxide film is embodied as the hafnium oxide film, the dopant may include at least one of gadolinium (Gd), silicon (Si), aluminum (Al), yttrium (Y), lanthanum (La), scandium (Sc), cerium (Ce), dysprosium (Dy), tantalum (Ta), strontium (Sr), and niobium (Nb). In another example, when the monometal oxide film is embodied as the rare earth metal oxide film belonging to the lanthanoids, the dopant may include at least one of silicon (Si), aluminum (Al), hafnium (Hf), zirconium (Zr), and niobium (Nb).

In another example, the ferroelectric material film may not include dopants doped in the monometal oxide film.

When the ferroelectric material film includes the monometal oxide film, the ferroelectric material film may have a thickness of, for example, 1 nm to 10 nm.

For example, the ferroelectric material film may include bimetal oxide. The ferroelectric material film may include a bimetal oxide film. In this regard, the bimetal oxide may be a ternary compound composed of two metals and oxygen. The ferroelectric material film including the bimetal oxide may have an orthorhombic crystal system.

The metals included in the bimetal oxide film may be, for example, hafnium (Hf) and zirconium (Zr). The bimetal oxide film may be a hafnium zirconium oxide film ($Hf_xZr_{(1-x)}O$). In the bimetal oxide film, x may be in a range of 0.2 to 0.8. In this regard, the hafnium zirconium oxide film ($Hf_xZr_{(1-x)}O$) may have a chemical formula that satisfies the stoichiometry or may have a chemical formula that does not satisfy the stoichiometry.

In one example, the ferroelectric material film may further include a dopant doped in the bimetal oxide film. The dopant may include at least one of gadolinium (Gd), silicon (Si), aluminum (Al), yttrium (Y), lanthanum (La), scandium (Sc), cerium (Ce), dysprosium (Dy), tantalum (Ta), and strontium (Sr). In another example, the ferroelectric material film may not include dopants doped in the bimetal oxide film.

When the ferroelectric material film includes the bimetal oxide film, the ferroelectric material film 132 may have a thickness in a range of 1 nm 20 nm, for example.

For example, the paraelectric material film may be or may include a dielectric film including zirconium (Zr) or a stack including a film made of zirconium (Zr). However, example embodiments are not limited thereto. Even when dielectric materials have the same chemical formula, one of the materials may exhibit ferroelectric properties while the other thereof may exhibit paraelectric properties, for example depending on crystal structures of the dielectric materials.

The paraelectric material may have a positive dielectric constant, and the ferroelectric material may have a negative dielectric constant in a certain section. For example, the paraelectric material may have a positive capacitance, and the ferroelectric material may have a negative capacitance.

In general, when two or more capacitors having a positive capacitance are connected to each other in series, a total capacitance thereof decreases. However, when a negative capacitor having a negative capacitance and a positive capacitor having a positive capacitance are connected to each other in series, a total capacitance thereof increases.

The upper electrode 250 may be disposed on the upper interfacial film 220. The upper electrode 250 may extend along a profile of the upper interfacial film 220. The upper electrode 250 may be spaced apart from the capacitor dielectric film 230 while the upper interfacial film 220 is interposed therebetween. Although it is illustrated the upper electrode 250 is embodied as a single film, this is only for convenience of illustration, and example embodiments are not limited thereto.

The upper electrode 250 may include, for example, one or more of a doped semiconductor material such as doped polysilicon, a conductive metal nitride such as one or more of titanium nitride, tantalum nitride, niobium nitride or tungsten nitride, and the like, a metal such as one or more of ruthenium, iridium, titanium or tantalum, and the like, or a conductive metal oxide such as one or more of iridium oxide or niobium oxide, and the like. However, example embodiments are not limited thereto. In the semiconductor device according to various example embodiments, the upper electrode 250 may include titanium nitride (TiN). Alternatively or additionally, in the semiconductor device according to various example embodiments, the upper electrode 250 may include niobium nitride (NbN).

A second interlayer insulating film 150 may be disposed on the upper electrode 250. The second interlayer insulating film 150 may include, for example, at least one of silicon oxide, silicon nitride, silicon oxynitride (SiON), silicon oxycarbonitride (SiOCN), and combinations thereof.

Figure 3:
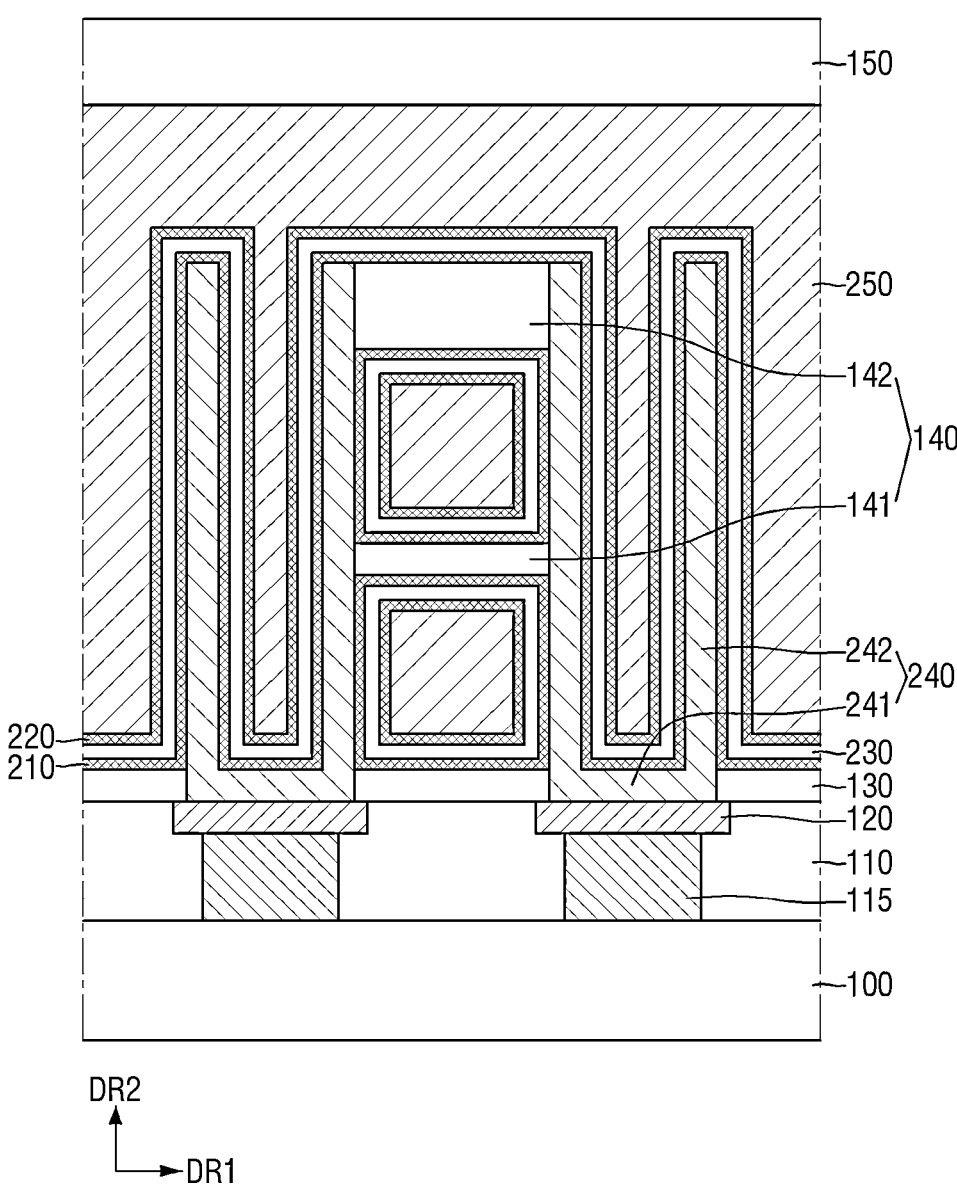
FIG. 3 is a diagram for illustrating a semiconductor device according to further various example embodiments.

FIG. 3 is a diagram for illustrating a semiconductor device according to further various example embodiments. For convenience of description, a following description is mainly based on differences thereof from the descriptions with reference to FIG. 1 and FIG. 2.

Referring to FIG. 3, in the semiconductor device according to various example embodiments, the lower electrode 240 may include a first extension 241 extending along a top face of the first landing pad 120 and a second extension 242 protruding from the first extension 241, e.g. from one end of the first extension 241.

The first extension 241 of the lower electrode 240 may be parallel to the substrate 100. The second extension 242 of the lower electrode 240 may extend in the second direction DR2.

The second extension 242 of the lower electrode 240 may have a three-dimensional shape such as a cylinder. For example, the lower electrode 240 may have a cylindrical shape and/or a prismatic shape.

Even in this case, the lower interfacial film 210 may extend along (conformally along) profiles of the lower electrode 240, the upper supporter pattern 142, the lower supporter pattern 141 and the etch stop layer 130. Specifically, the lower interfacial film 210 may extend along profiles of the first extension 241 and the second extension 242 of the lower electrode 240.

The capacitor dielectric film 230 and the upper interfacial film 220 may extend along a profile of the lower interfacial film 210. A total surface area of a capacitance including the lower interfacial film 210, the capacitor dielectric film 230, and the upper interfacial film 220 may be based on a total surface area thereof.

Figure 4:
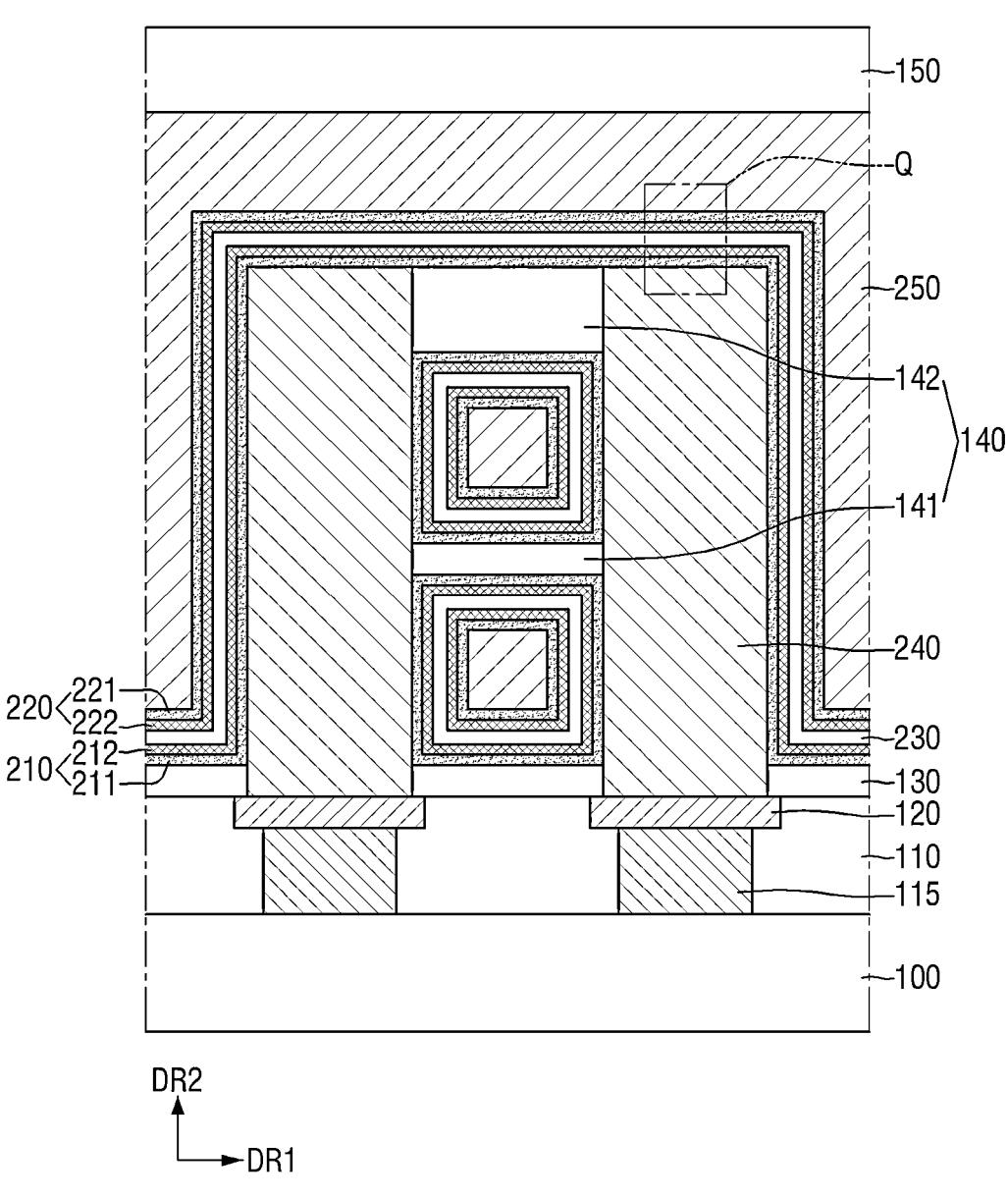
FIG. 4 is a diagram for illustrating a semiconductor device according to further various example embodiments.
Figure 5:
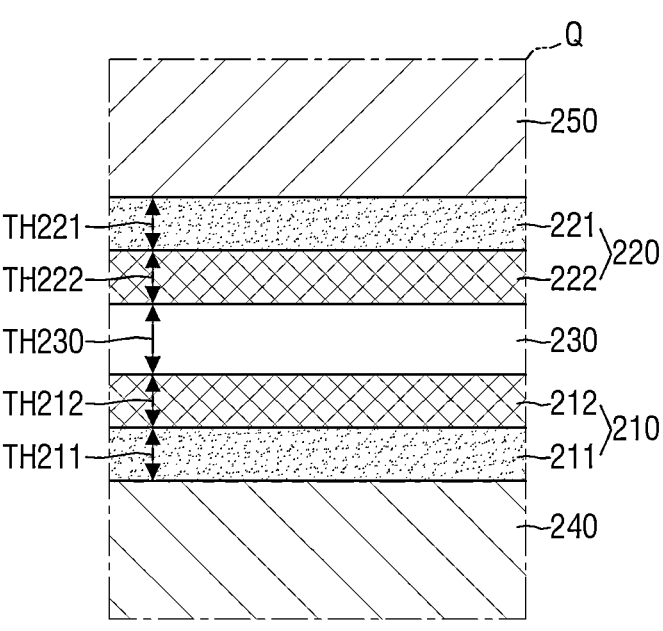
FIG. 5 is an enlarged view of a Q portion of FIG. 4.

FIG. 4 is a diagram for illustrating a semiconductor device according to further various example embodiments. FIG. 5 is an enlarged view of a Q portion of FIG. 4. For convenience of description, following description is mainly based on differences thereof from the descriptions with reference to FIG. 1 and FIG. 2.

Referring to FIGS. 4 and 5, the semiconductor device according to various example embodiments may include a multi-layered lower interfacial film 210 and a multi-layered upper interfacial film 220.

Specifically, the lower interfacial film 210 may include a first sub-lower interfacial film 211 and a second sub-lower interfacial film 212.

The first sub-lower interfacial film 211 may extend along profiles of the lower electrode 240, the upper supporter pattern 142, the lower supporter pattern 141, and the etch stop layer 130. The second sub-lower interfacial film 212 may extend along a profile of the first sub-lower interfacial film 211. The second sub-lower interfacial film 212 may be disposed between the first sub-lower interfacial film 211 and the capacitor dielectric film 230.

Each of a thickness TH211 of the first sub-lower interfacial film 211 and a thickness TH212 of the second sub-lower interfacial film 212 may be less than a thickness TH230 of the capacitor dielectric film 230. A sum of the thickness TH211 and the thickness TH212 may be less than a thickness TH230; however, example embodiments are not limited thereto, and the thickness TH211 may be less than the thickness TH230 and the thickness TH212 may be less than the thickness 230, while the sum of the thicknesses TH211 and TH212 may be greater than the thickness TH230.

In FIG. 5, the thickness TH211 of the first sub-lower interfacial film 211 and the thickness TH212 of the second sub-lower interfacial film 212 are equal to each other. However, embodiments are not limited thereto. The thickness TH211 of the first sub-lower interfacial film 211 and the thickness TH212 of the second sub-lower interfacial film 212 may be different from each other (e.g., the thickness TH211 may be greater than or less than the thickness TH212).

The upper interfacial film 220 may include a first sub-upper interfacial film 221 and a second sub-upper interfacial film 222.

The first sub-upper interfacial film 221 and the second sub-upper interfacial film 222 may extend along a profile of the capacitor dielectric film 230 and may be disposed on the capacitor dielectric film 230. The capacitor dielectric film 230 may be disposed between the second sub-lower interfacial film 212 and the second sub-upper interfacial film 222.

Each of a thickness TH221 of the first sub-upper interfacial film 221 and a thickness TH222 of the second sub-upper interfacial film 222 may be less than a thickness TH230 of the capacitor dielectric film 230.

In FIG. 5, the thickness TH221 of the first sub-upper interfacial film 221 and the thickness TH222 of the second sub-upper interfacial film 222 are equal to each other. However, example embodiments are not limited thereto. The thickness TH221 of the first sub-upper interfacial film 221 and the thickness TH222 of the second sub-upper interfacial film 222 may be different from each other.

Each of the first sub-lower interfacial film 211, the second sub-lower interfacial film 212, the first sub-upper interfacial film 221 and the second sub-upper interfacial film 222 includes a metal element with electronegativity greater than that of the metal element included in the capacitor dielectric film 230.

The first sub-lower interfacial film 211 and the second sub-lower interfacial film 212 may include different metal elements, e.g. may not include a common metal element. For example, the first sub-lower interfacial film 211 may include niobium oxide, and the second sub-lower interfacial film 212 may include tantalum oxide.

Further, the first sub-lower interfacial film 211 and the second sub-lower interfacial film 212 may be respectively films made of different materials but including the same metal element. For example, the first sub-lower interfacial film 211 may include niobium nitride, and the second sub-lower interfacial film 212 may include niobium oxide.

Similarly, the first sub-upper interfacial film 221 and the second sub-upper interfacial film 222 may include different metal elements. Further, the first sub-upper interfacial film 221 and the second sub-upper interfacial film 222 may be respectively films made of different materials but including the same metal element.

The first sub-lower interfacial film 211 and the first sub-upper interfacial film 221 may include the same metal element. For example, the first sub-lower interfacial film 211 and the first sub-upper interfacial film 221 may be respectively embodied as two films of an oxide film, a nitride film, and an oxynitride film including the same metal element. The first sub-lower interfacial film 211 may include tin oxide, and the first sub-upper interfacial film 221 may include tin nitride.

Further, the first sub-lower interfacial film 211 and the first sub-upper interfacial film 221 may be made of the same material. For example, the first sub-lower interfacial film 211 and the first sub-upper interfacial film 221 may include the same metal element, and may include the same nitride, the same oxide, or the same oxynitride. For example, both the first sub-lower interfacial film 211 and the first sub-upper interfacial film 221 may be respectively films including oxide-based niobium. Alternatively or additionally, both the first sub-lower interfacial film 211 and the first sub-upper interfacial film 221 may be respectively films including nitride-based niobium. Alternatively or additionally, both the first sub-lower interfacial film 211 and the first sub-upper interfacial film 221 may be respectively oxynitride films including niobium.

The second sub-lower interfacial film 212 and the second sub-upper interfacial film 222 may include the same metal element. The second sub-lower interfacial film 212 and the second sub-upper interfacial film 222 may be made of the same material. Descriptions of the second sub-lower interfacial film 212 and the second sub-upper interfacial film 222 are substantially the same as the descriptions of the first sub-lower interfacial film 211 and the first sub-upper interfacial film 221.

Referring to FIG. 5, the lower interfacial film 210 and the upper interfacial film 220 may have a symmetrical structure around the capacitor dielectric film 230. Specifically, the first sub-lower interfacial film 211 and the first sub-upper interfacial film 221 may include the same metal element. The second sub-lower interfacial film 212 and the second sub-upper interfacial film 222 may include the same metal element.

As used herein, the 'symmetry' may be applied to not only a case when the lower interfacial film 210 and the upper interfacial film 220 are made of the same material, but also a case when the lower interfacial film 210 and the upper interfacial film 220 are respectively films made of different materials including the same metal element. For example, when the lower interfacial film 210 is embodied as a film including niobium oxide and the upper interfacial film 220 is embodied as a film including niobium nitride, this case may be construed as having a symmetrical structure. Alternatively or additionally, when the lower interfacial film 210 is embodied as a film including niobium oxide, and the upper interfacial film 220 is embodied as a film including niobium oxide, this case may be construed as having a symmetrical structure.

Figure 6:
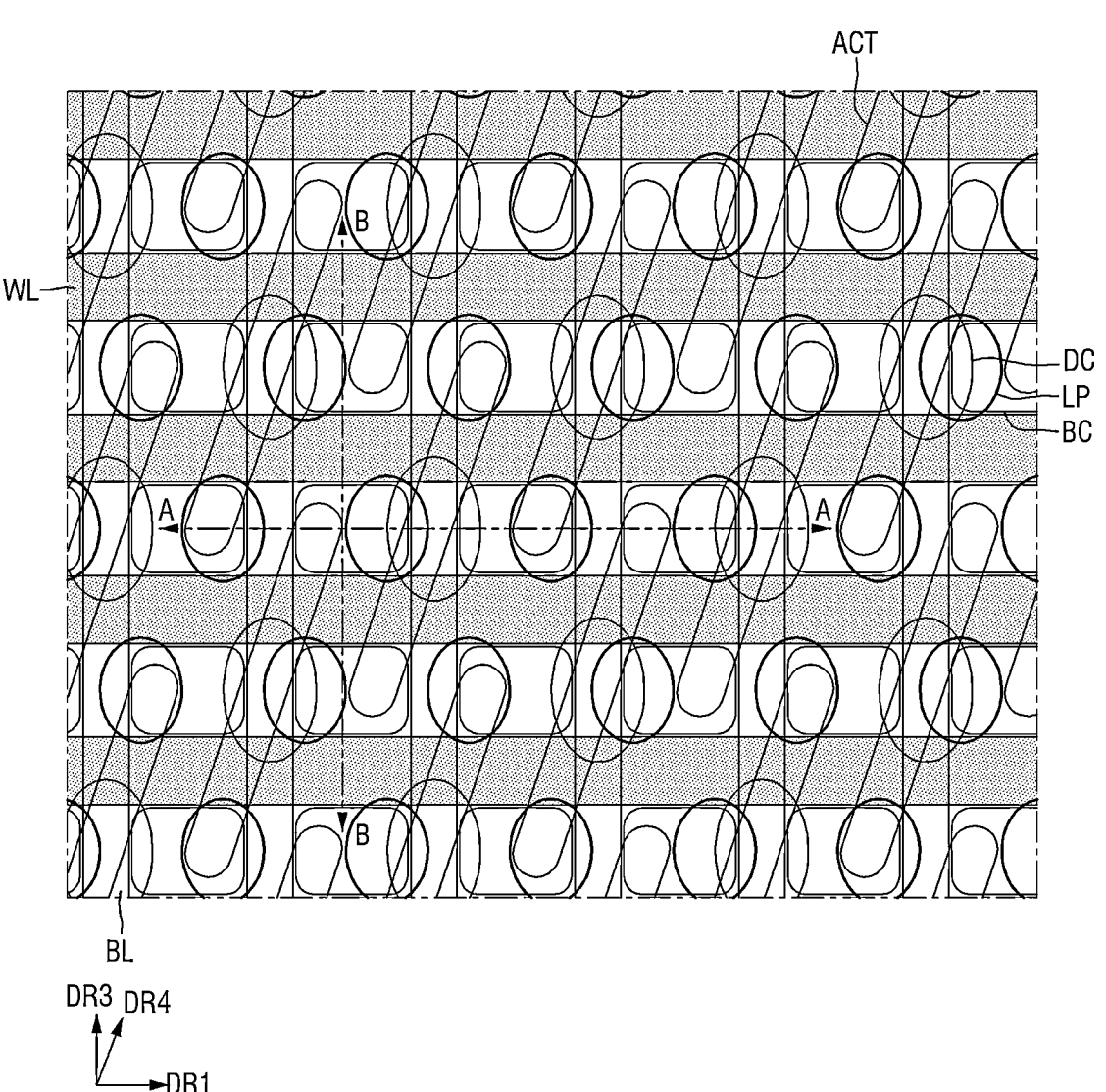
FIG. 6 is a schematic layout diagram for illustrating a semiconductor device according to various example embodiments.
Figure 7:
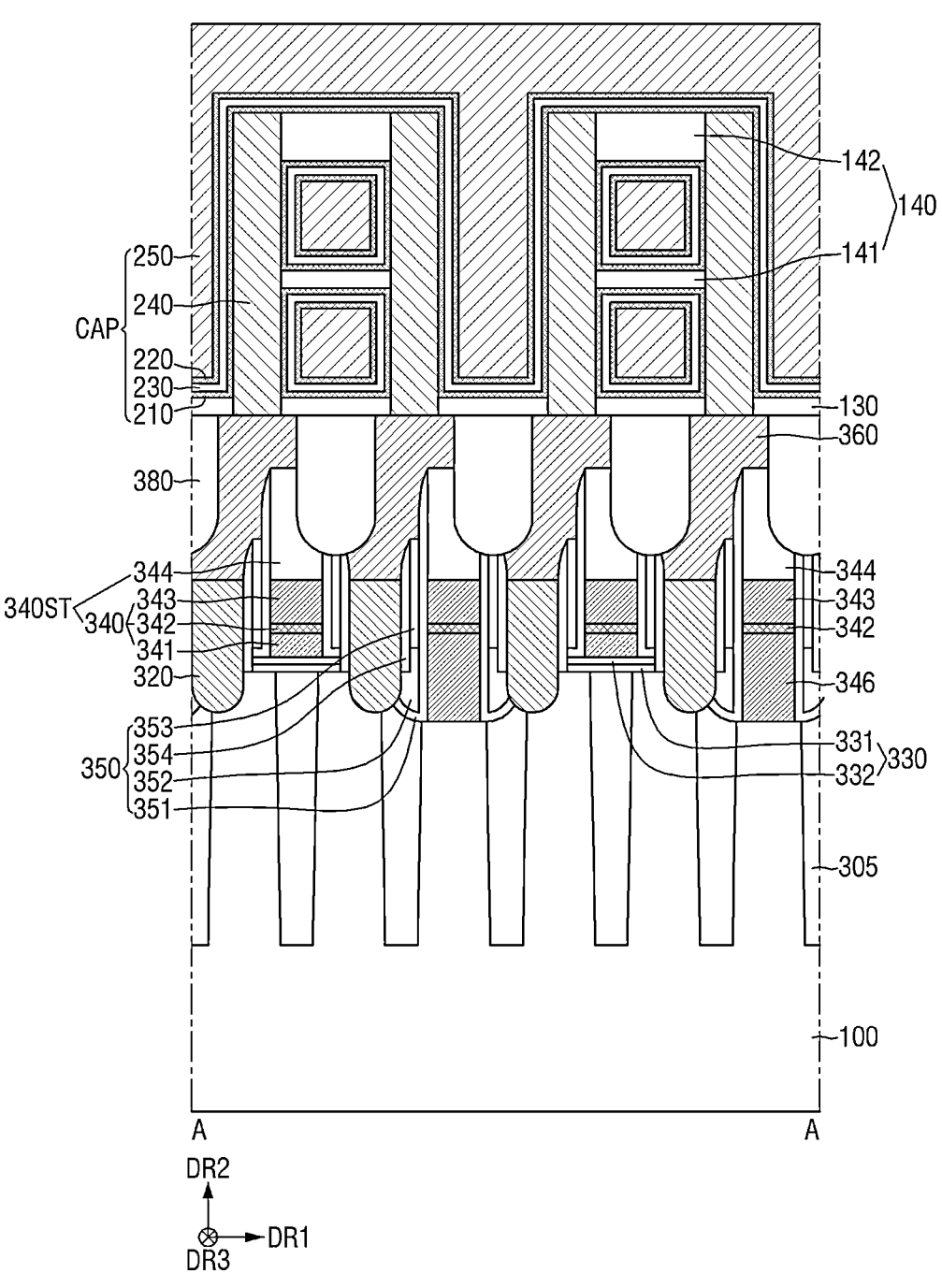
FIG. 7 is a cross-sectional view taken along A-A of FIG. 6.
Figure 8:
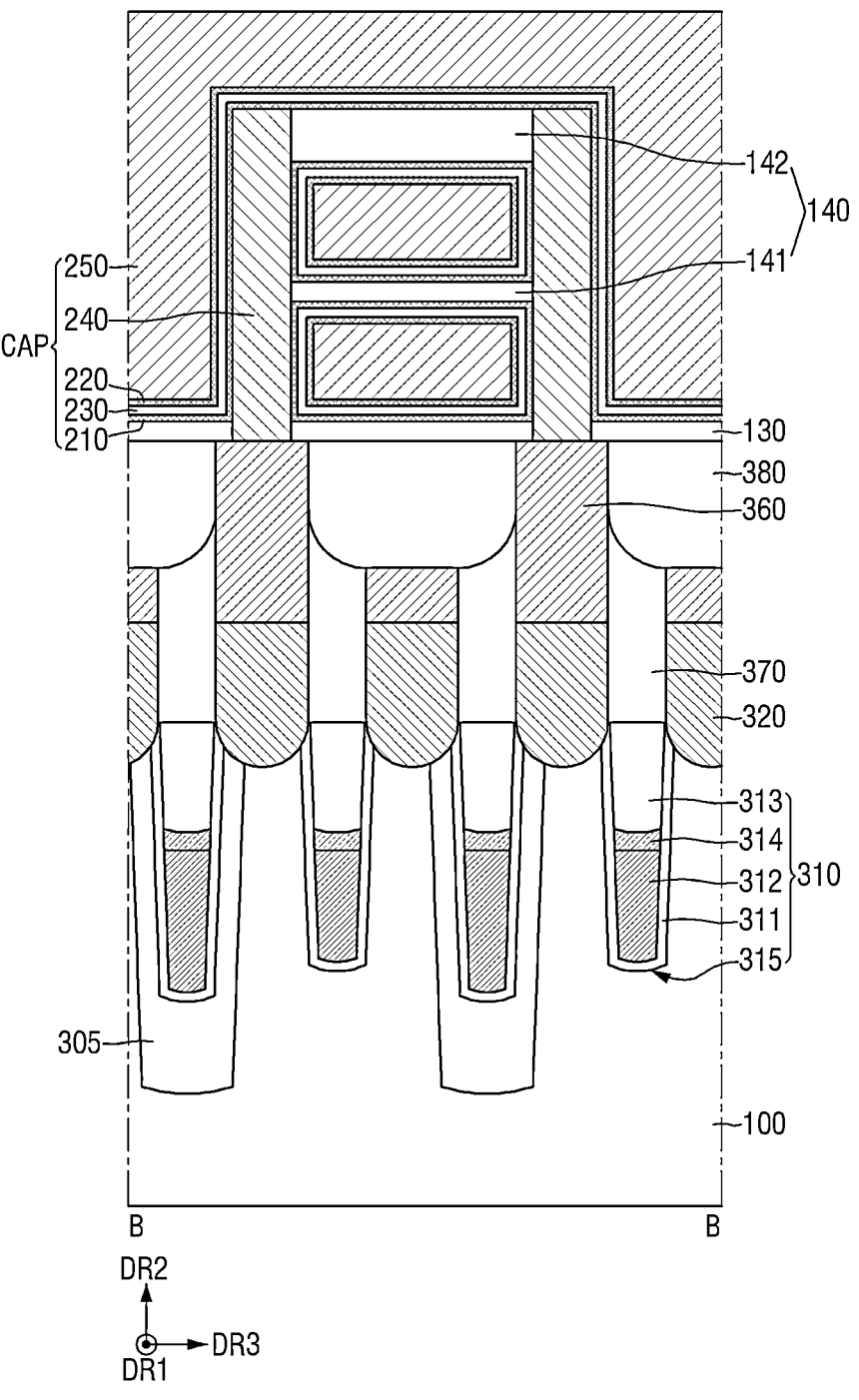
FIG. 8 is a cross-sectional view taken along B-B of FIG. 6.

FIG. 6 is a schematic layout diagram for illustrating a semiconductor device according to various example embodiments. FIG. 7 is a cross-sectional view taken along A-A of FIG. 6. FIG. 8 is a cross-sectional view taken along B-B of FIG. 6.

For reference, FIG. 6 shows an illustrative layout diagram (e.g. a plan view diagram) of DRAM (Dynamic Random Access Memory) excluding a capacitor CAP. However, example embodiments are not limited thereto.

Referring to FIG. 6, the semiconductor device according to various example embodiments may include a plurality of active areas ACT. The active area ACT may be defined by an element isolation film (305 in FIG. 7) formed within the substrate (100 in FIG. 7). As the design rule of the semiconductor device is reduced, the active area ACT may extend in a form of an oblique or diagonal linear bar as shown. The active area ACT may have a bar shape extending in a fourth direction DR4. The fourth direction DR4 may have an angle with the first direction DR1 that is not ninety degrees. For example, the fourth direction DR4 may have an angle with the first direction DR1 of between forty-five degrees and ninety degrees, e.g., with an angle of seventy degrees; however, example embodiments are not limited thereto.

A plurality of gate electrodes may be disposed on the active area ACT and may extend in the first direction DR1 across the active area ACT. The plurality of gate electrodes may extend in a parallel manner to each other. The plurality of gate electrodes may act as, for example, a plurality of word-lines WL.

The word-lines WL may be arranged so as to be spaced from each other by an equal spacing. A width of the word-line WL or a spacing between the word-lines WL may be determined according to the design rule.

A plurality of bit-lines BL extending in the third direction DR3 orthogonal to the extension direction of the word-line WL may be disposed on the word-lines WL. The plurality of bit-lines BL may extend in a parallel manner to each other.

The bit-lines BL may be arranged so as to be spaced from each other by an equal spacing, and/or may have a same width. A width of the bit-line BL and/or a spacing between the bit-lines BL may be determined according to the design rule.

The semiconductor device according to various example embodiments may include various contact arrangements formed on the active area ACT. The various contact arrangements may include, for example, a direct contact DC, a buried contact BC, and a landing pad LP, and the like.

In this regard, the direct contact DC (or bit line contact or digit line contact) may mean or correspond to a contact that electrically connects the active area ACT to the bit-line BL. The buried contact BC may mean or correspond to a contact connecting the active area ACT to the lower electrode (240 of FIG. 7) of the capacitor (CAP of FIG. 7).

In a layout structure, a contact area between the buried contact BC and the active area ACT may be small Accordingly, a conductive landing pad LP may be introduced to expand the contact area between the active area ACT and the buried contact BC, and to expand the contact area between the buried contact BC and the lower electrode (240 in FIG. 7) of the capacitor.

The landing pad LP may be disposed between the active area ACT and the buried contact BC, and between the buried contact BC and the lower electrode of the capacitor. The contact area may increase via or through the introduction of the landing pad LP, such that a contact resistance between the active area ACT and the capacitor lower electrode may be reduced.

In the semiconductor device according to various example embodiments, the direct contact DC may be disposed on a middle portion of the active area ACT. The buried contact BC may be disposed at each of both opposing ends of the active area ACT.

As the buried contact BC is disposed at each of both opposing ends of the active area ACT, the landing pad LP may be disposed adjacent to each of both opposing ends of the active area ACT and may partially overlap the buried contact BC.

For example, the buried contact BC may be formed to overlap the active area ACT and the cell element isolation film (305 in FIG. 7) between adjacent word-lines WL and between adjacent bit-lines BL.

The word-line WL may be formed as a structure buried in the substrate 100. The word-line WL may extend across the active area ACT between the direct contacts DC or between the buried contacts BC.

As shown, two word-lines WL may extend through one active area ACT. As the active area ACT extends along in the diagonal manner, the extension direction of the word-line WL may have an angle smaller than 90 degrees with respective to the extension direction of the active area ACT.

The direct contacts DC and the buried contacts BC may be arranged in a symmetrical manner Accordingly, the direct contacts DC and the buried contacts BC may be arranged in a straight line along the first direction DR1 and the third direction DR3.

Unlike the direct contact DC and the buried contact BC, the landing pads LP may be arranged in a zigzag manner in the third direction DR3 which the bit-line BL extends. Further, the landing pads LP may overlap with the same portion of a side face of each bit-line BL in the first direction DR1 in which the word-line WL extends.

For example, each of landing pads LP in a first line may overlap the left side face of a corresponding bit-line BL, while each of the landing pads LP in a second line may overlap with a right-side face of the corresponding bit-line BL.

Referring to FIGS. 6 to 8, the semiconductor device according to various example embodiments may include a gate structure 310, a plurality of bit-line structures 340ST, a second storage contact 320, and a capacitor CAP.

The element isolation film 305 may be formed in the substrate 100. The element isolation film 305 may have an STI (shallow trench isolation) structure having excellent element isolation ability. The element isolation film 305 may define the active area ACT on the substrate 100.

The active area ACT defined by the cell element isolation film 305 may have an elongate island shape including a minor axis and a major axis as shown in FIG. 6. The active area ACT may have a diagonally extension shape so as to have an angle of smaller than 90 degrees with respect to the extension direction of the word-line WL horizontally flush with the cell element isolation film 305.

The element isolation film 305 may include, for example, at least one of a silicon oxide film, a silicon nitride film, and a silicon oxynitride film. However, example embodiments are not limited thereto. Although the element isolation film 305 is illustrated as being embodied as one insulating film, this is only for convenience of illustration and the disclosure not limited thereto. Depending on a width of the element isolation film 305, each element isolation film 305 may be embodied as one insulating film or a stack of a plurality of insulating films.

Further, the active area ACT may have a diagonally extension shape so as to have an angle of smaller than 90 degrees with respect to an extension direction of the bit-line BL formed on the cell element isolation film 305. That is, the active area ACT may extend in the fourth direction DR4 having a predetermined angle with respect to the first direction DR1 and the third direction DR3.

The gate structure 310 may be formed in the substrate 100 and the element isolation film 305. The gate structure 310 may be formed across the element isolation film 305 and the active area ACT defined by the element isolation film 305. The gate structure 310 may include a gate trench 315 formed in the substrate 100 and the element isolation film 305, a gate insulating film 311, a gate electrode 312, a gate capping pattern 313, and a gate capping conductive film 314. In this regard, the gate electrode 312 may act as the word-line WL. Unlike what is illustrated, the gate structure 310 may not include the gate capping conductive film 314.

The gate insulating film 311 may extend along a sidewall and a bottom surface of the gate trench 315. The gate insulating film 311 may extend along a profile of at least portion of the gate trench 315. The gate insulating film 311 may include, for example, at least one of silicon oxide, silicon nitride, silicon oxynitride, or a high dielectric constant material having a higher dielectric constant than that of silicon oxide. The high dielectric constant material may include, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The gate electrode 312 may be formed on the gate insulating film 311. The gate electrode 312 may fill a portion of the gate trench 315. The gate capping conductive film 314 may extend along a top face of the gate electrode 312.

The gate electrode 312 may include at least one of a metal, a metal alloy, a conductive metal nitride, a conductive metal carbonitride, a conductive metal carbide, a metal silicide, a doped semiconductor material, a conductive metal oxynitride, and a conductive metal oxide. The gate electrode 312 may include, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof. However, example embodiments are not limited thereto. The gate capping conductive film 314 may include, for example, polysilicon or polysilicon germanium. However, example embodiments are not limited thereto.

The gate capping pattern 313 may be disposed on the gate electrode 312 and the gate capping conductive film 314. The gate capping pattern 313 may fill a remaining portion of the gate trench 315 except for the gate electrode 312 and the gate capping conductive film 314. The gate insulating film 311 is illustrated as extending along a sidewall of the gate capping pattern 313. However, example embodiments are not limited thereto. The gate capping pattern 313 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

Although not shown, an impurity doped area may be formed on at least one side of the gate structure 310. The impurity doped area may act as a source/drain area of the transistor.

The bit-line structure 340ST may include a cell conductive line 340 and a cell line capping film 344. The cell conductive line 340 may be formed on the substrate 100 on which the gate structure 310 has been formed, and on the element isolation film 305. The cell conductive line 340 may intersect the element isolation film 305 and the active area ACT. The cell conductive line 340 may intersect the gate structure 310. In this regard, the cell conductive line 340 may act as the bit-line BL.

The cell conductive line 340 may be embodied as a multilayer. The cell conductive line 340 may include, for example, a first cell conductive film 341, a second cell conductive film 342, and a third cell conductive film 343. The first to third cell conductive films 341, 342, and 343 may be sequentially stacked on the substrate 100 and the element isolation film 305. Although the cell conductive line 340 is shown to be embodied as a triple layer, example embodiments are not limited thereto.

Each of the first to third cell conductive films 341, 342, and 343 may include, for example, at least one of a semiconductor material doped with impurities, a conductive silicide compound, a conductive metal nitride, and a metal alloy. For example, the first cell conductive film 341 may include a doped semiconductor material, the second cell conductive film 342 may include at least one of a conductive silicide compound and a conductive metal nitride, and the third cell conductive film 343 may include at least one of a metal and a metal alloy may include. However, example embodiments are not limited to.

A bit-line contact 346 may be formed between the cell conductive line 340 and the substrate 100. For example, the cell conductive line 340 may be formed on the bit-line contact 346. For example, the bit-line contact 346 may be formed at a point where the cell conductive line 340 intersects a middle portion of the active area ACT having an elongate island shape.

The bit-line contact 346 may electrically connect the cell conductive line 340 and the substrate 100 to each other. In this regard, the bit-line contact 346 may act as the direct contact DC. The bit-line contact 346 may include, for example, at least one of a semiconductor material doped with impurities, a conductive silicide compound, a conductive metal nitride, and a metal.

In FIG. 7, in an area overlapping a top face of the bit-line contact 346, the cell conductive line 340 may include a second cell conductive film 342 and a third cell conductive film 343. In an area non-overlapping the top face of the bit-line contact 346, the cell conductive line 340 may include the first to third cell conductive films 341, 342, and 343.

The cell line capping film 344 may be disposed on the cell conductive line 340. The cell line capping film 344 may extend along a top face of the cell conductive line 340 in the third direction DR3. In this regard, the cell line capping film 344 may include, for example, at least one of a silicon nitride film, a silicon oxynitride, a silicon carbonitride, and a silicon oxycarbonitride. In the semiconductor memory device according to various example embodiments, the cell line capping film 344 may include, for example, a silicon nitride film. Although the cell line capping film 344 is illustrated as being embodied as a single film, example embodiments are not limited thereto. The cell line capping film 344 may be embodied as a multilayer. However, when films constituting the multilayer are made of the same material, the cell line capping film 344 may be construed as being embodied as a single film.

The cell insulating film 330 may be formed on the substrate 100 and the element isolation film 305. More specifically, the cell insulating film 330 may be formed on a portion of the substrate 100 on which the bit-line contact 346 is not formed, and on the element isolation film 305. The cell insulating film 330 may be formed between the substrate 100 and the cell conductive line 340 and between the element isolation film 305 and the cell conductive line 340.

The cell insulating film 330 may be embodied as a single film. However, as shown, the cell insulating film 330 may be embodied as a multi-layer including a first cell insulating film 331 and a second cell insulating film 332. For example, the first cell insulating film 331 may include a silicon oxide film, and the second cell insulating film 332 may include a silicon nitride film. However, example embodiments are not limited thereto.

The cell line spacer 350 may be disposed on a sidewall of each of the cell conductive line 340 and the cell line capping film 344. In an area of the cell conductive line 340 where the bit-line contact 346 is formed, the cell line spacer 350 may be formed on the substrate 100 and the element isolation film 305. The cell line spacer 350 may be disposed on the sidewall of each of the cell conductive line 340, the cell line capping film 344 and the bit-line contact 346.

However, in a remaining area of the cell conductive line 340 where the bit-line contact 346 is not formed, the cell line spacer 350 may be disposed on the cell insulating film 330. The cell line spacer 350 may be disposed on the sidewalls of the cell conductive line 340 and the cell line capping film 344.

The cell line spacer 350 may be embodied as a single layer. However, as illustrated, the cell line spacer 350 may be embodied as a multilayer including first to fourth cell line spacers 351, 352, 353 and 354. For example, each of the first to fourth cell line spacers 351, 352, 353, and 354 may include one of a silicon oxide film, a silicon nitride film, a silicon oxynitride film (SiON), a silicon oxycarbonitride film (SiOCN), air, and combinations thereof. However, the present invention is not limited thereto.

For example, the second cell line spacer 352 may not be disposed on the cell insulating film 330, but may be disposed on the sidewall of the bit-line contact 346. The fourth cell line spacer 354 may be disposed on a top face of the gate structure 310, and the fourth cell line spacer 354 may extend along a sidewall of the cell conductive line 340 adjacent thereto in the first direction DR1, and a top face of the gate capping pattern 313. For example, the second cell line spacer 352 may not be disposed on the cell insulating film 330, but may be disposed on the sidewall of the bit-line contact 346.

A fence pattern 370 may be disposed on the substrate 100 and the element isolation film 305. The fence pattern 370 may be formed so as to overlap the gate structure 310 formed in the substrate 100 and the element isolation film 305. The fence pattern 370 may be disposed between the bit-line structures 340ST extending in the third direction DR3. The fence pattern 370 may include, for example, at least one of silicon oxide, silicon nitride, silicon oxynitride, and a combination thereof.

The second storage contact 320 may be disposed between bit-lines BL to each other in the first direction DR1. Specifically, the second storage contact 320 may be disposed between cell conductive lines 340 adjacent to each other in the first direction DR1. The second storage contact 320 may be disposed between fence patterns 370 adjacent to each other in the third direction DR3. The second storage contact 320 may overlap portions of the substrate 100 and the element isolation film 305 between the adjacent cell conductive lines 340. The second storage contact 320 may be connected to the active area ACT. In this regard, the second storage contact 320 may act as the buried contact BC. Further, the second storage contact 320 may act as the first storage contact 115 in FIGS. 1 to 5.

The second storage contact 320 may include, for example, at least one of a semiconductor material doped with impurities, a conductive silicide compound, a conductive metal nitride, and a metal.

A storage pad 360 may be formed on the second storage contact 320. The storage pad 360 may be electrically connected to the second storage contact 320. The storage pad 360 may be connected to the active area. The storage pad 360 may act as the landing pad LP. Further, the storage pad 360 may act as the first landing pad 120 in FIGS. 1 to 5.

The storage pad 360 may overlap (or at least partially overlap) a portion of the top face of the bit-line structure 340ST. The storage pad 360 may include, for example, at least one of a semiconductor material doped with impurities, a conductive silicide compound, a conductive metal nitride, a conductive metal carbide, a metal, and a metal alloy.

A pad isolation insulating film 380 may be formed on the storage pad 360 and the bit-line structure 340ST. For example, the pad isolation insulating film 380 may be disposed on the cell line capping film 344. The pad isolation insulating film 380 may isolate the storage pads 360 as a plurality of isolated areas from each other. The pad isolation insulating film 380 may not cover the top face of the storage pad 360. For example, a vertical dimension from the top face of the substrate 100 to a top face of the storage pad 360 may be the same as a vertical dimension from the top face of the substrate 100 to a top face of the pad isolation insulating film 380.

The pad isolation insulating film 380 may include an insulating material, and may electrically insulate the plurality of storage pads 360 from each other. For example, the pad isolation insulating film 380 may include, for example, at least one of a silicon oxide film, a silicon nitride film, a silicon oxynitride film, a silicon oxycarbonitride film, and a silicon carbonitride film.

The etch stop layer 130 may be disposed on the top face of the storage pad 360 and the top face of the pad isolation insulating film 380. The etch stop layer 130 may include, for example, at least one of silicon nitride (SiN), silicon carbonitride (SiCN), silicon oxycarbonitride (SiOCN), silicon oxycarbide SiOC, and silicon boron nitride (SiBN).

The capacitor CAP may be disposed on the storage pad 360. The capacitor CAP may be connected to the storage pad 360. For example, the capacitor CAP may be electrically connected to the second storage contact 320.

The capacitor CAP may include the lower electrode 240, the lower interfacial film 210, the capacitor dielectric film 230, the upper interfacial film 220, and the upper electrode 250. The lower supporter pattern 141 and the upper supporter pattern 142 may be formed on the etch stop layer 130.

The descriptions of the lower electrode 240, the capacitor dielectric film 230, the upper electrode 250, the lower interfacial film 210, and the upper interfacial film 220 included in the capacitor CAP are substantially the same as the descriptions with reference to FIG. 1 to FIG. 5.

Figure 9:
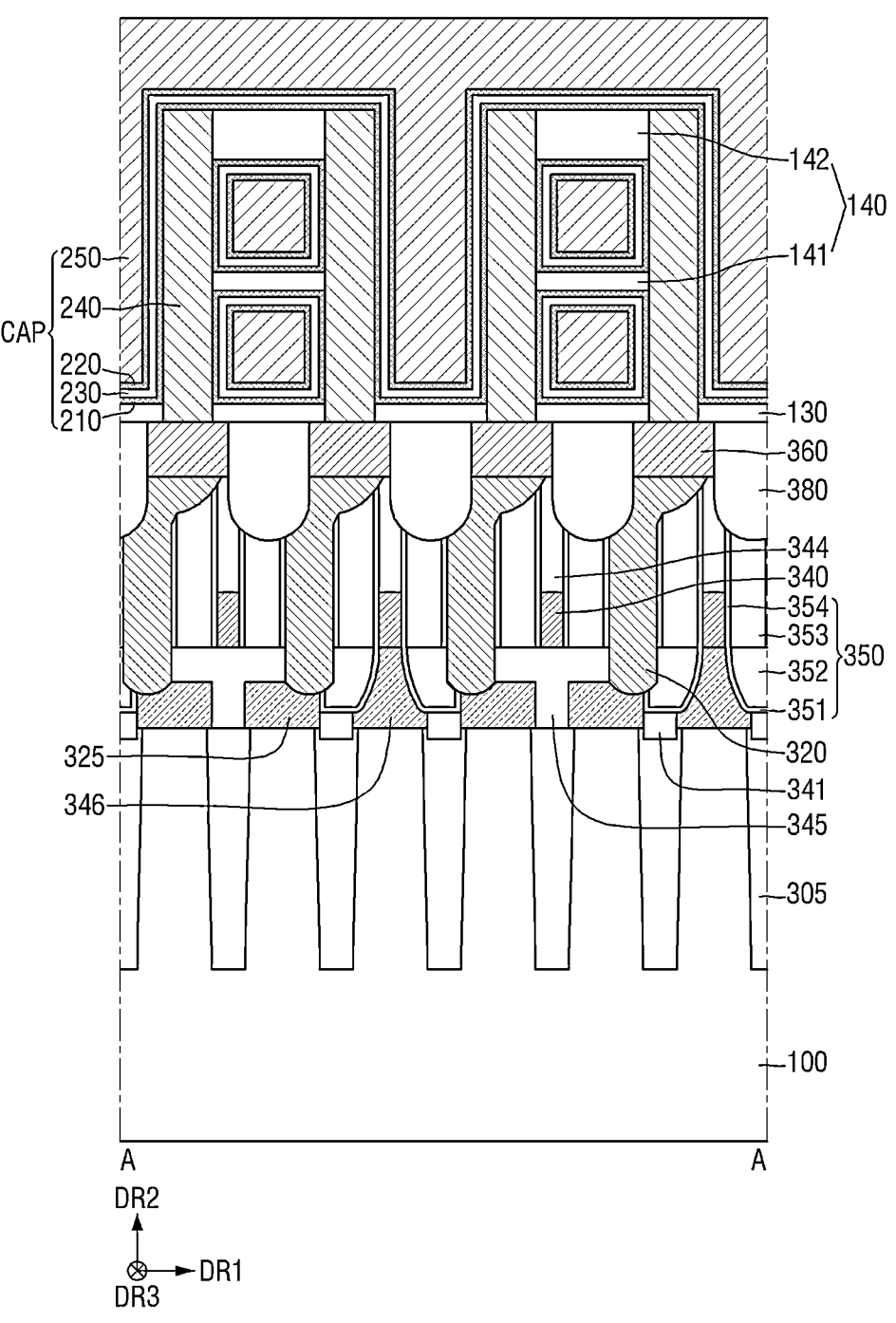
FIG. 9 is a diagram for illustrating a semiconductor device according to further various example embodiments.

FIG. 9 is a diagram for illustrating a semiconductor device according to further various example embodiments. For reference, FIG. 9 shows a cross-sectional view taken along A-A of FIG. 6. For convenience of description, following description is mainly based on differences thereof from those described with reference to FIGS. 6 to 8.

Referring to FIG. 9, the semiconductor device according to various example embodiments may further include a node pad 325.

The bit-line contact 346 includes a top face connected to the cell conductive line 340 and a bottom face connected to the active area of the substrate 100. A dimension of the top face of the bit-line contact 346 in the first direction DR1 may be smaller than a dimension of a bottom face of the bit-line contact 346 in the first direction DR1. As the bit-line contact 346 extends away from the cell conductive line 340, a width of the bit-line contact 346 may gradually increase. For example, the width of the bit-line contact 346 may gradually increase as the bit-line contact extends in a direction from a top to a bottom thereof.

The node pad 325 may be disposed on the substrate 100. The node pad 325 may be disposed on the active area. The node pad 325 may be disposed between the second storage contact 320 and the substrate 100.

A vertical dimension from a top face of the element isolation film 305 to a top face of the node pad 325 may be smaller than a vertical dimension from the top face of the element isolation film 305 to a top face of the bit-line contact 346. A vertical dimension from the top face of the element isolation film 305 to the top face of the node pad 325 may be smaller than a vertical dimension from the top face of the element isolation film 305 to a bottom face of the cell conductive line 340.

A contact isolation pattern 341 may be interposed between the bit-line contact 346 and the node pad 325 adjacent thereto. The contact isolation pattern 341 may include an insulating material.

A node isolation pattern 345 may be interposed between adjacent node pads 325. A node isolation pattern 345 is disposed on the substrate 100. The node isolation pattern 345 may isolate the node pads 325 adjacent to each other in the first direction DR1 from each other. The node isolation pattern 345 may cover top faces of the node pads 325 adjacent to each other in the first direction DR1. In a cross-sectional view, the node isolation pattern 345 may have a "T" shape.

A top face of the node isolation pattern 345 may be coplanar with the top face of the bit-line contact 346. A vertical dimension from the top face of the element isolation film 305 to the top face of the node isolation pattern 345 may be equal to a vertical dimension from the top face of the element isolation film 305 to the top face of the bit-line contact 346. The vertical dimension from the top face of the element isolation film 305 to the top face of the node isolation pattern 345 may be equal to a vertical dimension from the top face of the element isolation film 305 to the bottom face of the cell conductive line 340.

The node isolation pattern 345 may include, for example, an insulating material. A bottom face of the node isolation pattern 345 may have the same vertical level as that of the top face of the element isolation film 305. However, example embodiments are not limited thereto. A vertical level of the bottom face of the node isolation pattern 345 may be lower than that of the top face of the element isolation film 305.

A stacked structure of a portion of the cell conductive line 340 in an area overlapping the top face of the bit-line contact 346 may be the same as a stacked structure of a portion of the cell conductive line 340 in an area non-overlapping the top face of the bit-line contact 346.

The second storage contact 320 is connected to node pad 325. The second storage contact 320 connects the node pad 325 and the storage pad 360 to each other.

FIGS. 10 to 15 are diagrams of intermediate structures of steps for illustrating a method for manufacturing a semiconductor device according to various example embodiments.

Figure 10:
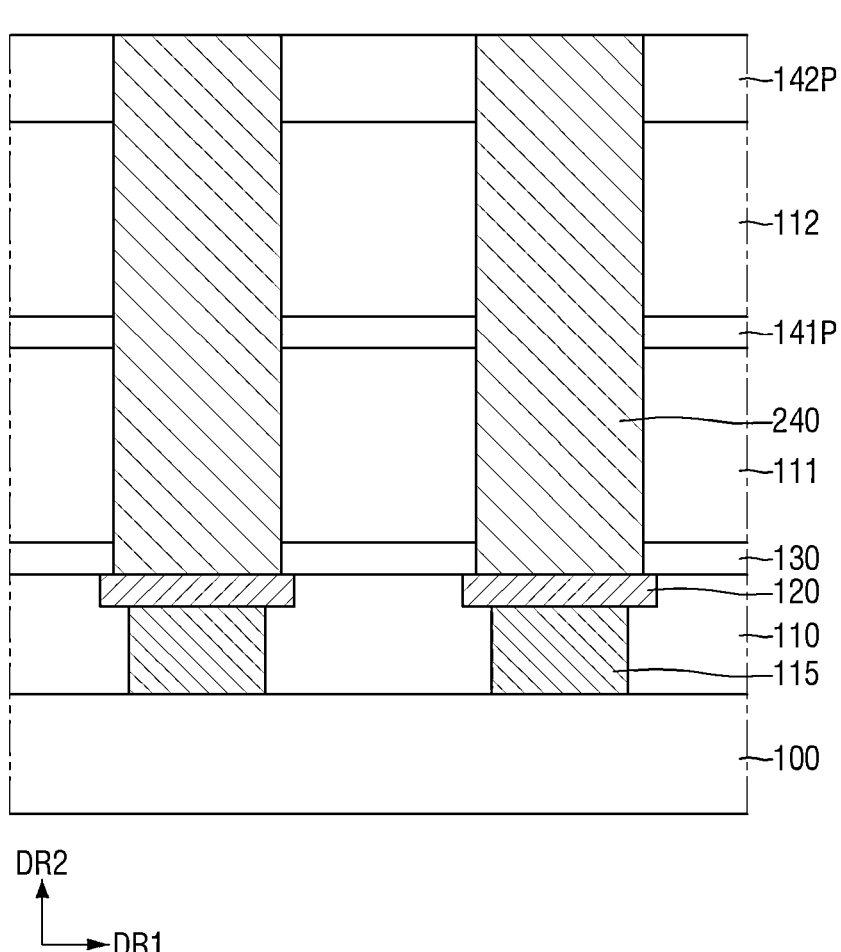
FIGS. 10 to 15 are diagrams of intermediate structures of steps for illustrating a method for manufacturing a semiconductor device according to various example embodiments.

Referring to FIG. 10, the first storage contact 115 and the first landing pad 120 may be formed in the interlayer insulating film 110 on the substrate 100.

The etch stop layer 130, a lower mold film 111, a lower supporter film 141p, an upper mold film 112, and an upper supporter film 142p may be sequentially formed on the first interlayer insulating film 110.

The lower electrode 240 extending through the etch stop layer 130, the lower mold film 111, the lower supporter film 141p, the upper mold film 112 and the upper supporter film 142p may be formed on the first landing pad 120.

Figure 11:
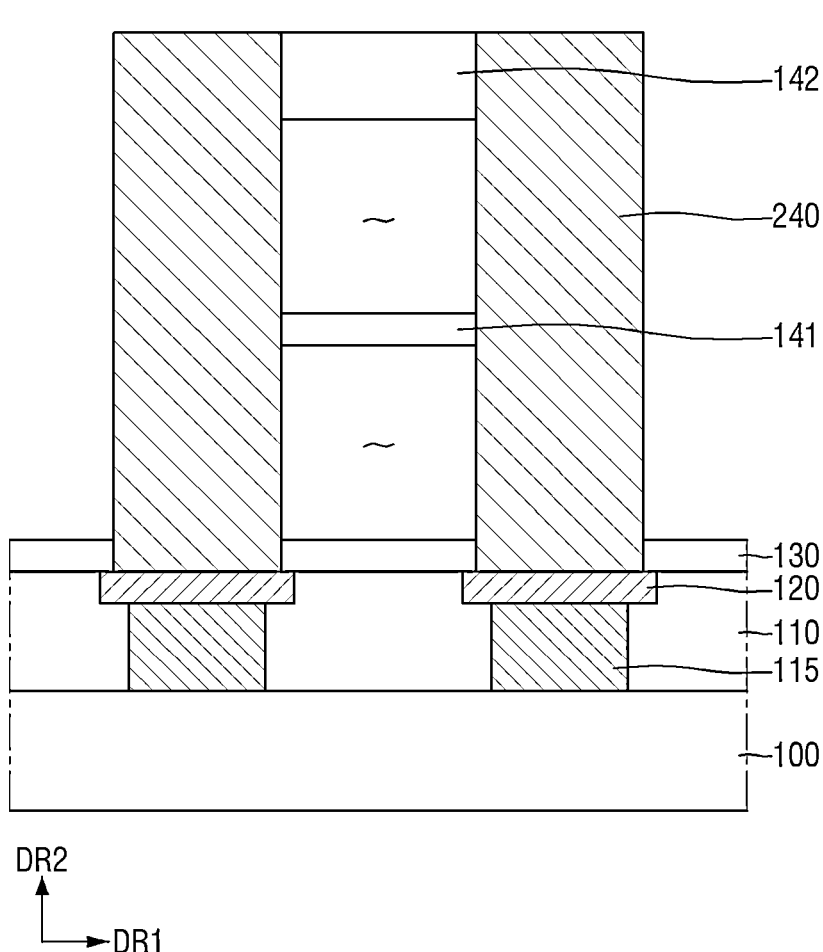

Referring to FIG. 11, the upper supporter pattern 142 and the lower supporter pattern 141 connecting adjacent lower electrodes 240 to each other may be formed. Each of the upper supporter pattern 142 and the lower supporter pattern 141 may be in contact with a portion of the sidewall of the lower electrode 240.

A portion of the upper supporter film 142p may be removed such that the upper supporter pattern 142 may be formed. The upper mold film 112 may be removed through an area where the upper supporter pattern 142 is not formed.

Subsequently, a portion of the lower supporter film 141p may be removed such that the lower supporter pattern 141 may be formed. The lower mold film 111 may be removed through an area where the lower supporter pattern 141 is not formed.

Thus, a space may be formed between the upper supporter pattern 142 and the lower supporter pattern 141, and between the lower supporter pattern 141 and the etch stop layer 130.

Figure 12:
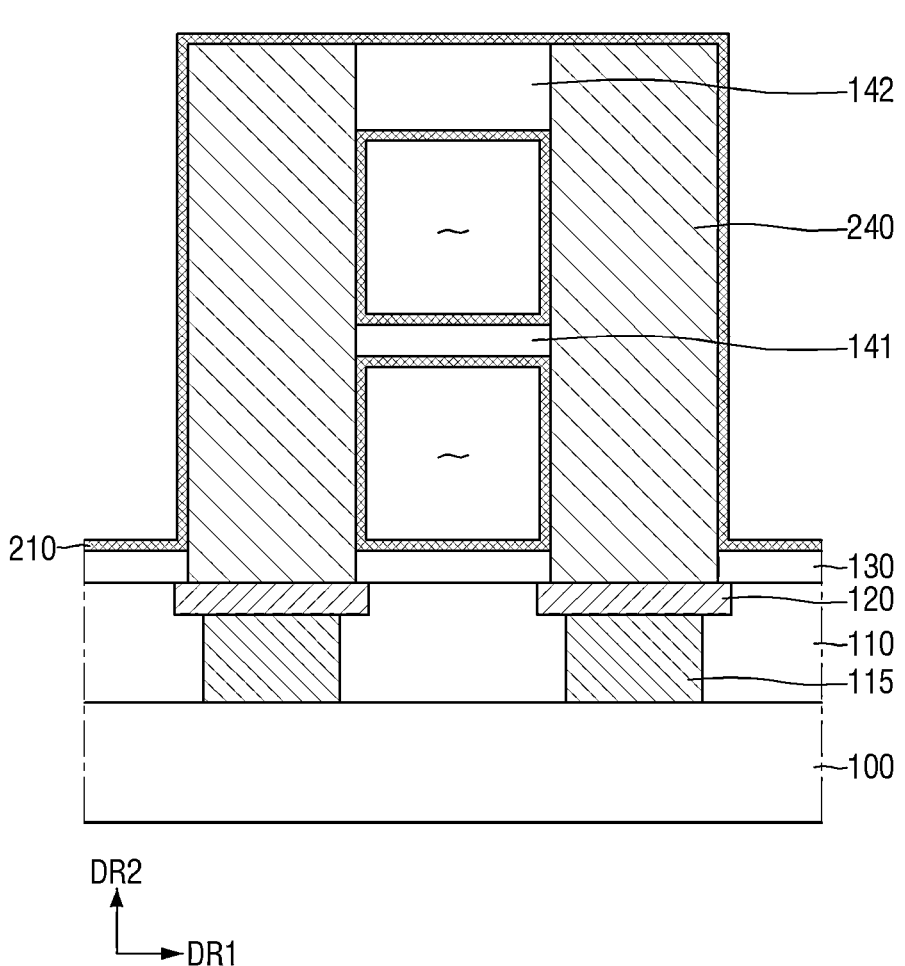

Referring to FIG. 12, the lower interfacial film 210 may be formed on the lower electrode 240.

The lower interfacial film 210 may be formed along a surface of the lower electrode 240, a surface of the lower supporter pattern 141, a surface of the upper supporter pattern 142, and a top face of the etch stop layer 130. The lower interfacial film 210 may be formed along profiles of the lower electrode 240, the upper supporter pattern 142, the lower supporter pattern 141 and the etch stop layer 130. The lower interfacial film 210 may be formed with a deposition process such as a chemical vapor deposition process (CVD) process such as a plasma-enhanced CVD (PECVD) process and/or an atomic layer deposition (ALD) process. The lower interfacial film 210 may be formed conformally.

Figure 13:
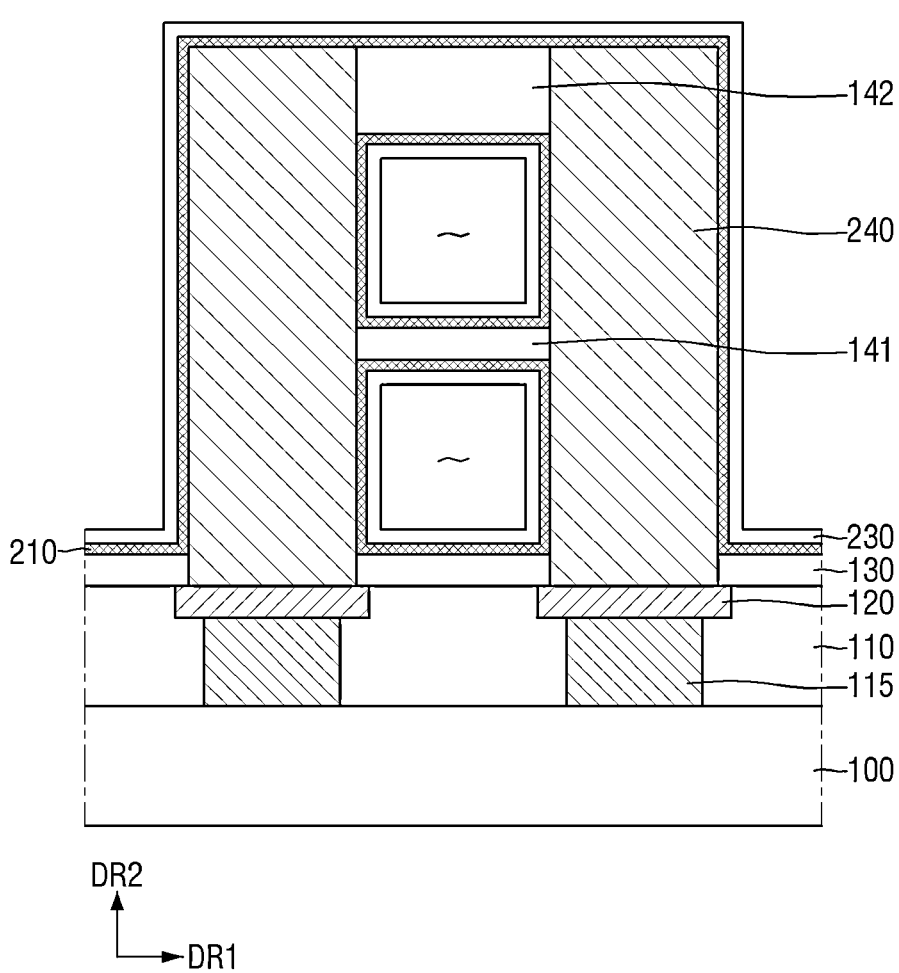

Referring to FIG. 13, the capacitor dielectric film 230 may be formed on the lower interfacial film 210.

The capacitor dielectric film 230 may be formed along a profile of the lower interfacial film 210. The capacitor dielectric film 230 may not be in direct contact with the lower electrode 240. The capacitor dielectric film 230 may be formed with a deposition process such as a chemical vapor deposition process (CVD) process such as a plasma-enhanced CVD (PECVD) process and/or an atomic layer deposition (ALD) process. The capacitor dielectric film 230 may be formed conformally, and may or may not be formed within a same process chamber, e.g. may or may not be formed in-situ with the process chamber used in forming the lower interfacial film 210.

Figure 14:
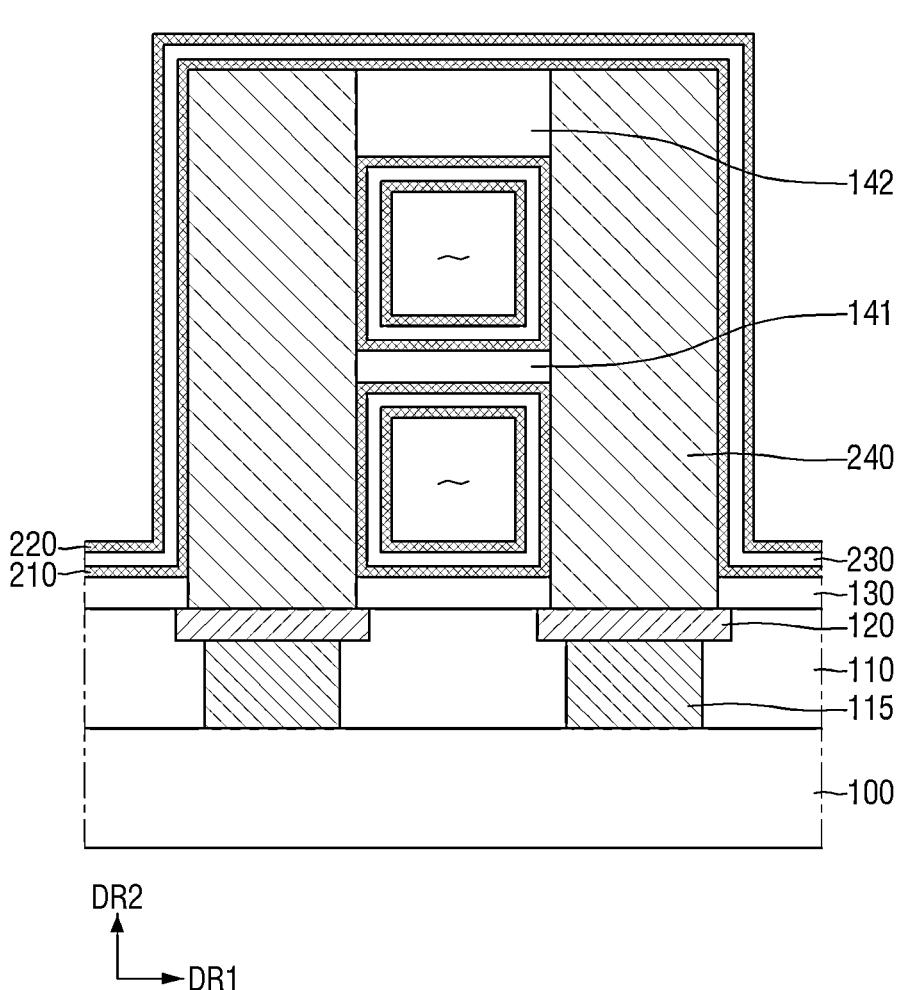

Referring to FIG. 14, the upper interfacial film 220 may be formed on the capacitor dielectric film 230. The upper interfacial film 220 may be formed along a profile of the capacitor dielectric film 230. The upper interfacial film 220 may be formed with a deposition process such as a chemical vapor deposition process (CVD) process such as a plasma-enhanced CVD (PECVD) process and/or an atomic layer deposition (ALD) process. The upper interfacial film 220 may be formed conformally, and may or may not be formed within a same process chamber, e.g. may or may not be formed in-situ with either or both of the process chamber used in forming the lower interfacial film 210 and the capacitor dielectric film 230.

Figure 15:
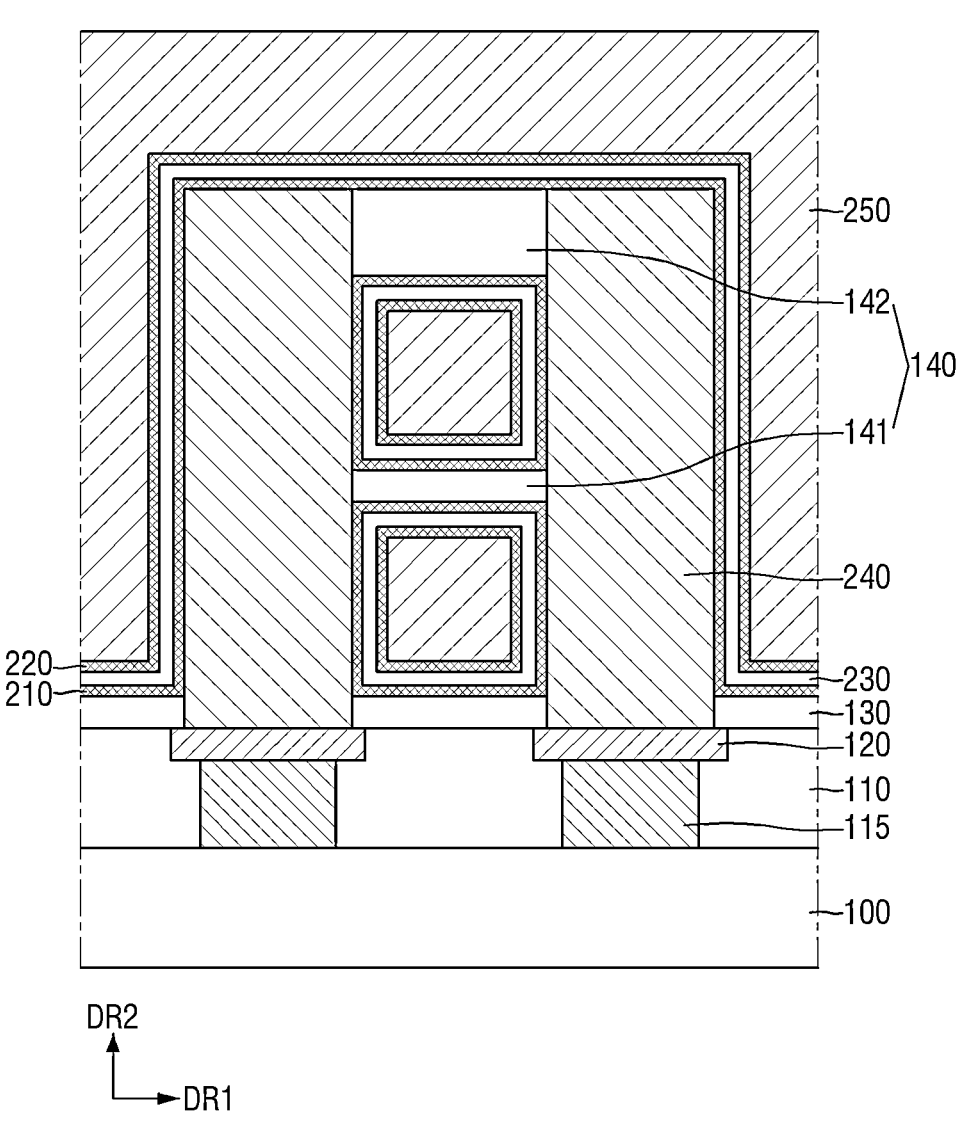

Referring to FIG. 15, the upper electrode 250 may be formed on the upper interfacial film 220.

The upper electrode 250 may be formed along a profile of the upper interfacial film 220. The upper electrode 250 may not directly contact the capacitor dielectric film 230.

Figure 16:
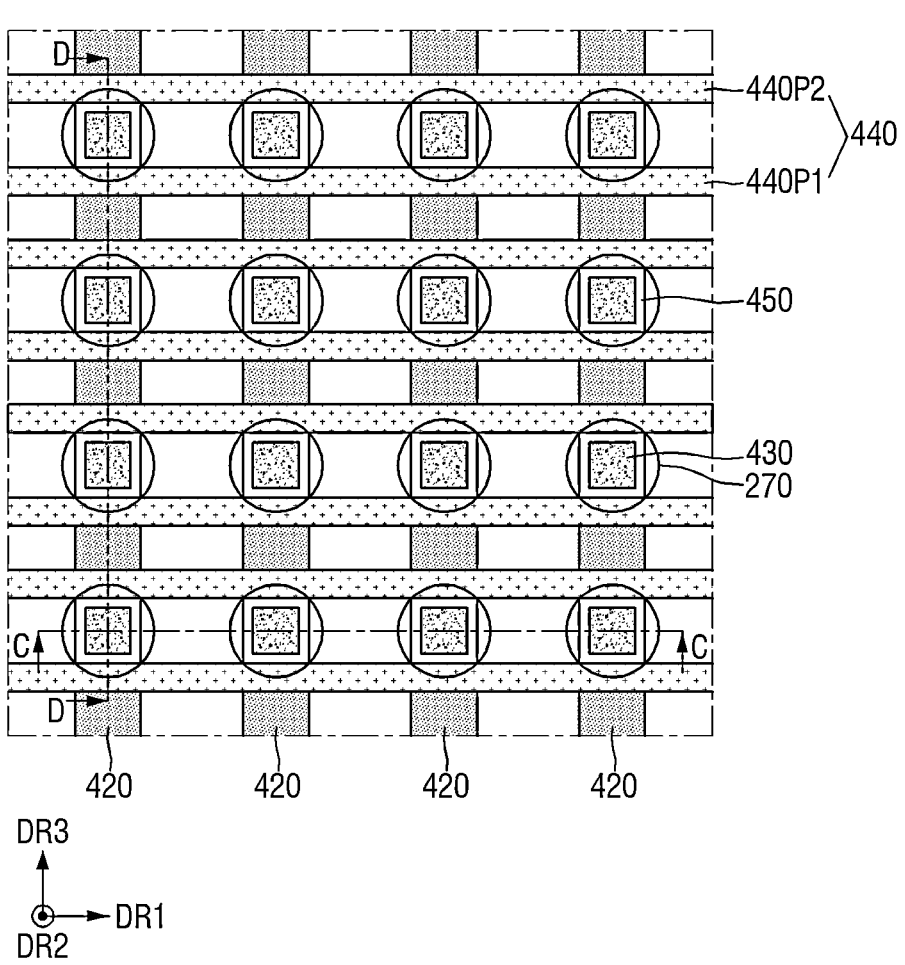
FIG. 16 is a layout diagram for illustrating a semiconductor device according to various example embodiments.
Figure 17:
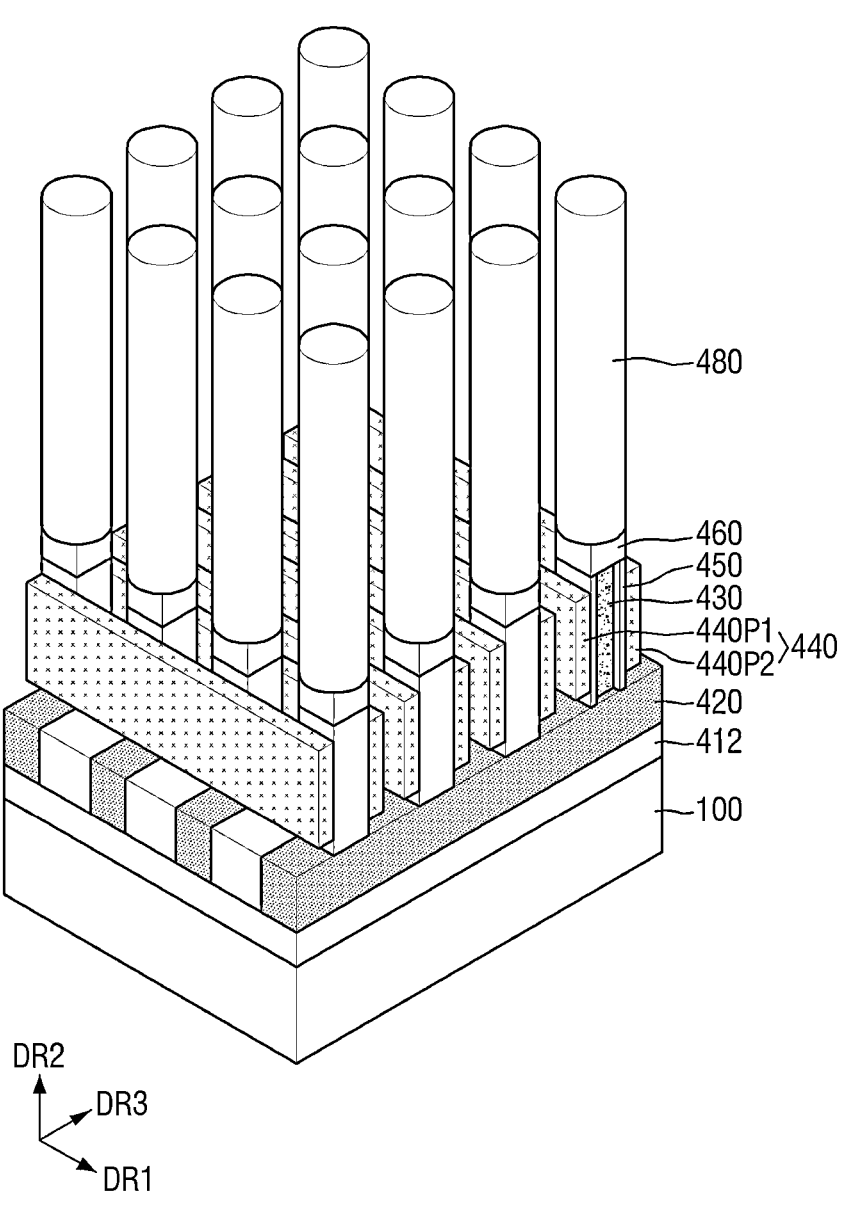
FIG. 17 is a perspective view for illustrating a semiconductor device according to various example embodiments.
Figure 18:
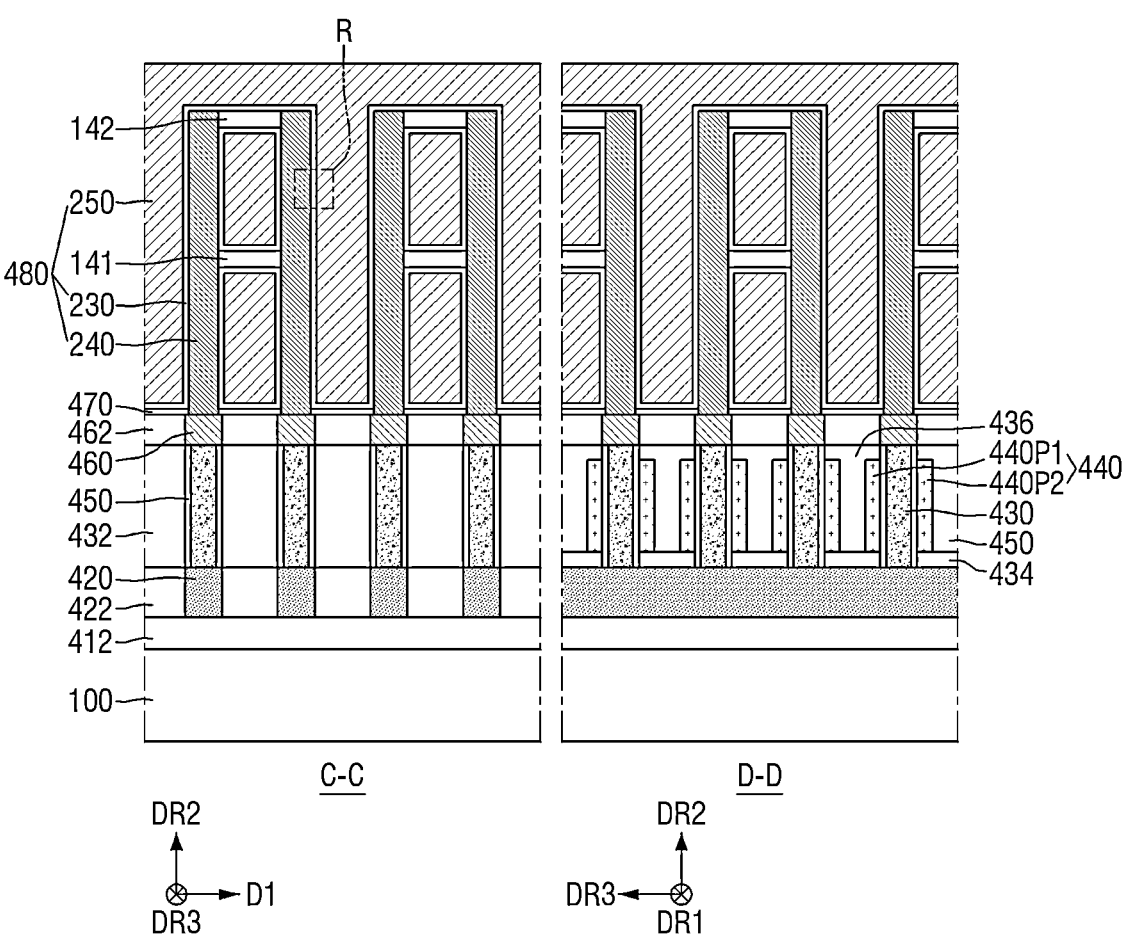
FIG. 18 is a cross-sectional view taken along C-C and D-D of FIG. 16.
Figure 19:
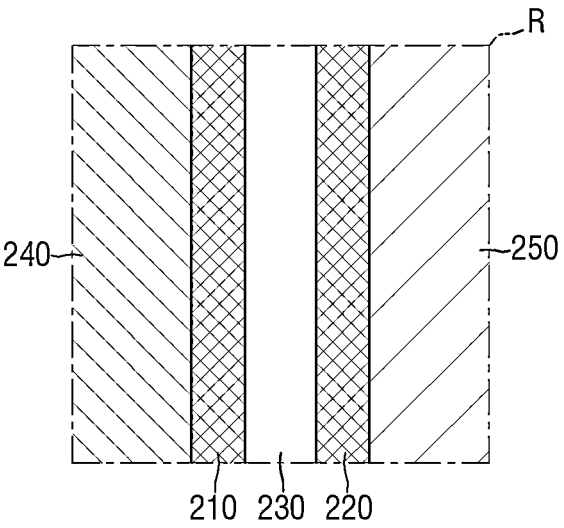
FIG. 19 is an enlarged view of a R portion of FIG. 18.

FIG. 16 is a layout diagram for illustrating a semiconductor device according to various example embodiments. FIG. 17 is a perspective view for illustrating a semiconductor device according to various example embodiments. FIG. 18 is a cross-sectional view taken along C-C and D-D of FIG. 16. FIG. 19 is an enlarged view of a R portion of FIG. 18.

Referring to FIG. 16 to FIG. 19, the semiconductor device may include a substrate 100, a plurality of first conductive lines 420, a channel layer 430, a gate electrode 440, a gate insulating layer 450, and a capacitor structure 480. The semiconductor device of FIG. 16 to FIG. 19 may be or may include a memory device including a vertical channel transistor (VCT). The vertical channel transistor may refer to a structure in which a channel length of the channel layer 430 extends along a vertical direction from the substrate 100.

The capacitor structure 480 in FIGS. 16 to 19 may be the same as the capacitor CAP as described with reference to FIGS. 6 to 9.

A lower insulating layer 412 may be disposed on the substrate 100. The plurality of first conductive lines 420 may be disposed on the lower insulating layer 412 and may be spaced apart from each other in the first direction DR1 and extend in the third direction DR3. A plurality of first insulating patterns 422 may be disposed on the lower insulating layer 412 so as to fill spaces between adjacent ones of the plurality of first conductive lines 420. The plurality of first insulating patterns 422 may extend in the third direction DR3. A top face of each of the plurality of first insulating patterns 422 may be coplanar with a top face of each of the plurality of first conductive lines 420. Each of the plurality of first conductive lines 420 may function as a bit-line of the semiconductor device.

In various example embodiments, each of the plurality of first conductive lines 420 may include doped polysilicon, metal, conductive metal nitride, conductive metal silicide, conductive metal oxide, or a combination thereof. For example, each of the plurality of first conductive lines 420 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, example embodiments are not limited thereto. Each of the plurality of first conductive lines 420 may include a single layer or multiple layers made of the aforementioned materials. In various example embodiments, each of the plurality of first conductive lines 420 may include a two-dimensional (2D) semiconductor material. For example, the 2D semiconductor material may include graphene, carbon nanotube, or a combination thereof.

The channel layers 430 may be arranged in a matrix form and may be spaced apart from each other in the first direction DR1 and the third direction DR3 and may be disposed on the plurality of first conductive lines 420. The channel layer 430 may have a first width along the first direction DR1 and a first vertical dimension along the second direction DR2. The first vertical dimension may be larger than the first width. For example, the first vertical dimension may be about 2 to 10 times the first width. However, example embodiments are not limited thereto. A bottom portion of the channel layer 430 may function as a first source/drain area (not shown), and a top portion of the channel layer 430 may function as a second source/drain area (not shown), and a portion of the channel layer 430 between the first and second source/drain areas may function as a channel area (not shown).

In various example embodiments, the channel layer 430 may include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_yS_zO$, $Yb_x$-$Ga_yZn_zO$, $In_xGa_yO$ or combinations thereof. The channel layer 430 may include a single layer or multiple layers made of the oxide semiconductor. In various example embodiments, the channel layer 430 may have a bandgap energy greater than that of silicon. For example, the channel layer 430 may have a bandgap energy of about 1.5 eV to about 5.6 eV. For example, the channel layer 430 may have optimal channel performance when it has a bandgap energy of about 2.0 eV to 4.0 eV. For example, the channel layer 430 may be made of polycrystalline or amorphous. However, example embodiments are not limited thereto. In various example embodiments, the channel layer 430 may include a two-dimensional (2D) semiconductor material. For example, the 2D semiconductor material may include graphene, carbon nanotubes, or a combination thereof.

The gate electrode 440 may extend in the first direction DR1 and may be disposed on both opposing sidewalls of the channel layer 430. The gate electrode 440 may include a first sub-gate electrode 440P1 facing a first sidewall of the channel layer 430 and a second sub-gate electrode 440P2 facing a second sidewall opposite the first sidewall of the channel layer 430. As one channel layer 430 is disposed between the first sub-gate electrode 440P1 and the second sub-gate electrode 440P2, the semiconductor device may have a dual gate transistor structure. However, the technical idea of example embodiments are not limited thereto, and the second sub-gate electrode 440P2 may be omitted and only the first sub-gate electrode 440P1 facing the first sidewall of the channel layer 430 may be formed to achieve a single gate transistor structure.

The gate electrode 440 may include doped polysilicon, metal, conductive metal nitride, conductive metal silicide, conductive metal oxide, or a combination thereof. For example, the gate electrode 440 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, example embodiments are not limited thereto.

The gate insulating layer 450 may surround a sidewall of the channel layer 430 and may be interposed between the channel layer 430 and the gate electrode 440. For example, as shown in FIG. 29, an entirety of the sidewall of the channel layer 430 may be surrounded with the gate insulating layer 450. A portion of the sidewall of the gate electrode 440 may be in contact with the gate insulating layer 450. In further various example embodiments, the gate insulating layer 450 may extend in an extension direction of the gate electrode 440, that is, the first direction DR1, and only two sidewalls facing the gate electrode 440 among the sidewalls of the channel layer 430 may be in contact with the gate insulating layer 450.

In various example embodiments, the gate insulating layer 450 may be composed of a silicon oxide film, a silicon oxynitride film, a high dielectric constant film having a higher dielectric constant than that of a silicon oxide film, or a combination thereof. The high dielectric constant film may be made of metal oxide or metal oxynitride. For example, the high dielectric constant film as the gate insulating layer 450 may be made of $HfO_2$, HfSiO, HfSiON, HfTaO, HfTiO, HfZrO, $ZrO_2$, $Al_2O_3$, or a combination thereof. However, example embodiments are not limited thereto.

A plurality of second insulating patterns 432 may be respectively disposed on the plurality of first insulating patterns 422 and may extend along the third direction DR3. The channel layer 430 may be disposed between two adjacent second insulating patterns 432 among the plurality of second insulating pattern 432. Further, a first buried layer 434 and a second buried layer 436 may be disposed between two adjacent second insulating patterns 432 and in a space between two adjacent channel layers 430. The first buried layer 434 may be disposed at a bottom portion of the space between two adjacent channel layers 430, and the second buried layer 436 may be formed on the first buried layer 434 so as to fill the remainder of the space between two adjacent channel layers 430. A top face of the second buried layer 436 may be coplanar with a top face of the channel layer 430, and the second buried layer 436 may cover a top face of the gate electrode 440. Alternatively, the plurality of second insulating patterns 432 may be continuous and monolithic with the plurality of first insulating patterns 422, respectively, or the second filling layer 436 may be continuous and monolithic with the first filling layer 434.

A capacitor contact 460 may be disposed on the channel layer 430. The capacitor contact 460 may vertically overlap the channel layer 430. The capacitor contacts 460 may be arranged in a matrix form and may be spaced apart from each other in the first direction DR1 and the third direction DR3. The capacitor contact 460 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, example embodiments are not limited thereto. An upper insulating layer 462 may surround a sidewall of the capacitor contact 460 and may be disposed on the plurality of second insulating patterns 432 and the second buried layer 436.

An etch stop layer 470 may be disposed on the upper insulating layer 462, and the capacitor structure 480 may be disposed on the etch stop layer 470. The capacitor structure 480 may include the lower electrode 240, the capacitor dielectric film 230 and the upper electrode 250.

The lower electrode 240 may extend through the etch stop layer 470 and may be electrically connected to a top face of the capacitor contact 460. The lower electrode 240 may be formed in a pillar type extending in the second direction DR2. However, example embodiments are not limited thereto. In various example embodiments, the lower electrode 240 may vertically overlap the capacitor contact 460. The lower electrodes may be arranged in a matrix form and may be spaced apart from each other in the first direction DR1 and the third direction DR3. Alternatively, a landing pad (not shown) may be further disposed between the capacitor contact 460 and the lower electrode 240 so that the lower electrodes 240 may be arranged in a hexagonal manner The lower interfacial film 210 is disposed on the lower electrode 240. The lower interfacial film 210 is disposed between the lower electrode 240 and the capacitor dielectric film 230. The upper interfacial film 220 is disposed on the capacitor dielectric film 230. The upper interfacial film 220 is disposed between the capacitor dielectric film 230 and the upper electrode 250.

Figure 20:
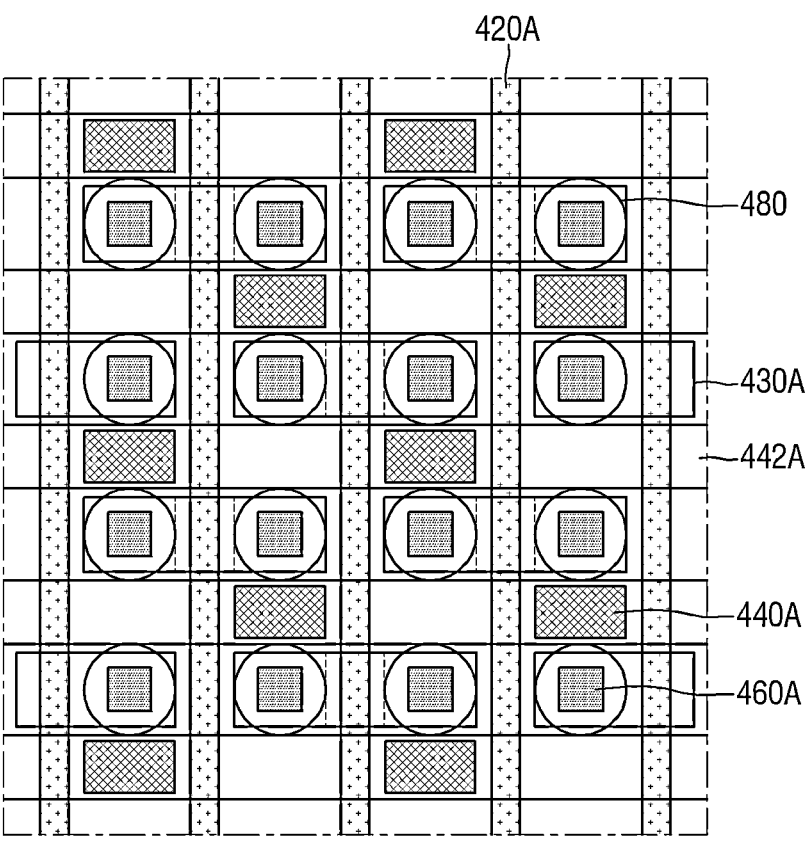
FIG. 20 is a layout diagram for illustrating a semiconductor device according to various example embodiments.
Figure 20:
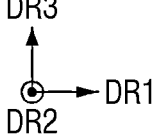
Figure 21:
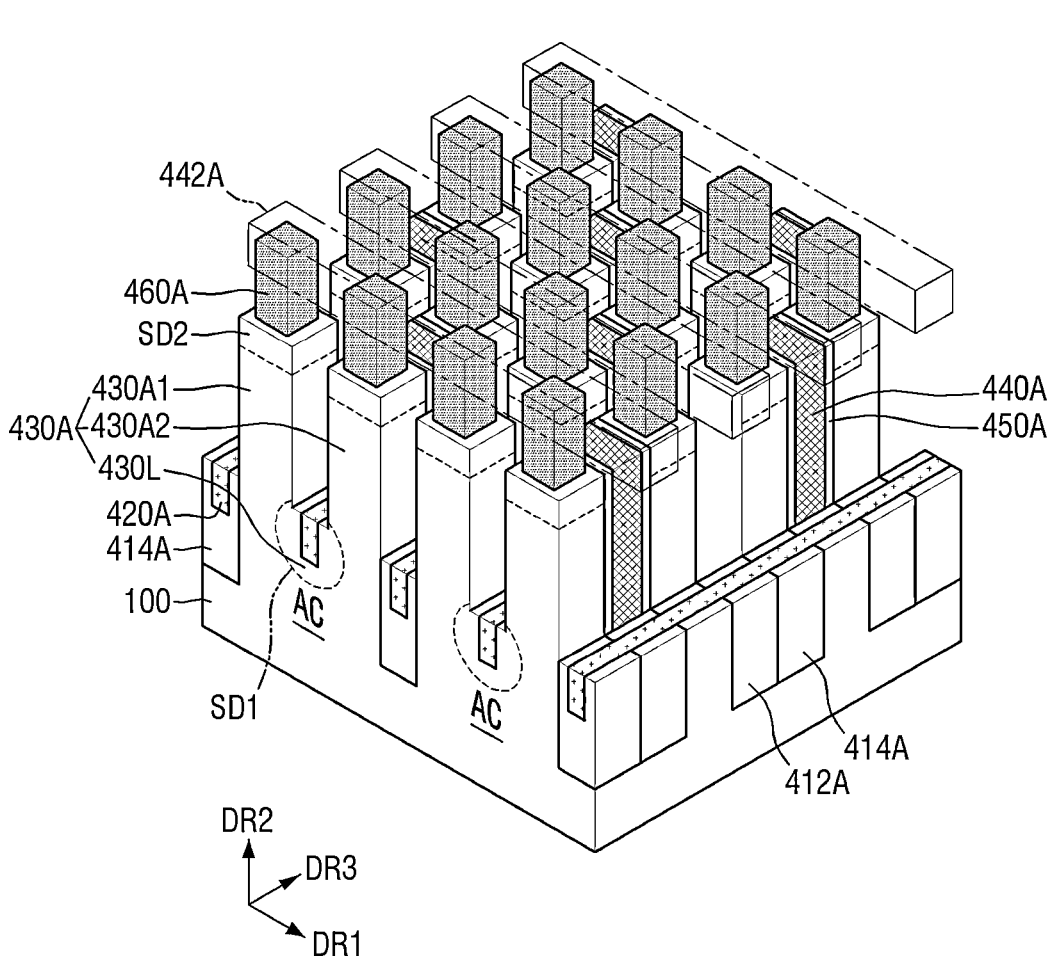
FIG. 21 is a perspective view for illustrating a semiconductor device according to various example embodiments.

FIG. 20 is a layout diagram for illustrating a semiconductor device according to various example embodiments. FIG. 21 is a perspective view for illustrating a semiconductor device according to various example embodiments.

Referring to FIG. 20 and FIG. 21, the semiconductor device may include a substrate 100, a plurality of first conductive lines 420A, a channel structure 430A, a contact gate electrode 440A, a plurality of second conductive lines 442A, and the capacitor structure 480. The semiconductor device may be a memory device including a vertical channel transistor (VCT).

A plurality of active area AC may be defined in the substrate 100 and by a first element isolation film 412A and a second element isolation film 414A. The channel structure 430A may be disposed in each active area AC. The channel structure 430A may include a first active pillar 430A1 and a second active pillar 430A2 extending in a vertical direction, and a connective portion 430L connected to a bottom portion of the first active pillar 430A1 and a bottom portion of the second active pillar 430A2. A first source/drain area SD1 may be disposed in the connective portion 430L. A second source/drain area SD2 may be disposed at a top portion of each of the first and second active pillars 430A1 and 430A2. Each of the first active pillar 430A1 and the second active pillar 430A2 may constitute an independent unit memory cell.

The plurality of first conductive lines 420A may extend so as to intersect the plurality of active areas AC. For example, the plurality of first conductive lines 420A may extend in the third direction DR3. One first conductive line 420A of the plurality of first conductive lines 420A may be disposed on the connective portion 430L and between the first active pillar 430A1 and the second active pillar 430A2, and may be disposed on the first source/drain area SD1. Another first conductive line 420A adjacent to said one first conductive line 420A may be disposed between two channel structures 430A. One first conductive line 420A among the plurality of first conductive lines 420A may function as a common bit-line of two-unit memory cells respectively including the first active pillar 430A1 and the second active pillar 430A2 respectively disposed on both opposing sides of said one first conductive line 420A.

One contact gate electrode 440A may be disposed between two channel structures 430A adjacent to each other in the third direction DR3. For example, the contact gate electrode 440A may be disposed between the first active pillar 430A1 included in one channel structure 430A and the second active pillar 430A2 of another channel structure 430A adjacent thereto. One contact gate electrode 440 may be shared by the first active pillar 430A1 and the second active pillar 430A2 respectively disposed on both sidewalls thereof. A gate insulating layer 450A may be disposed between the contact gate electrode 440A and the first active pillar 430A1 and between the contact gate electrode 440A and the second active pillar 430A2. A plurality of second conductive lines 442A may extend in the first direction DR1 and may be disposed on a top face of the contact gate electrode 440A. Each of the plurality of second conductive lines 442A may function as a word-line of the semiconductor device.

A capacitor contact 460A may be disposed on the channel structure 430A. The capacitor contact 460A may be disposed on the second source/drain area SD2. The capacitor structure 480 may be disposed on the capacitor contact 460A.

In concluding the detailed description, those of ordinary skill in the art will appreciate that many variations and modifications may be made to various example embodiments without substantially departing from the principles of the present invention. Furthermore, example embodiments are not necessarily mutually exclusive. For example, some example embodiments may include one or more features described with reference to one or more figure, and may also include one or more features described with reference to one or more other figures. Therefore, the disclosed preferred embodiments of the invention are used in a generic and descriptive sense only and not for purposes of limitation.

What is claimed is:

1. A semiconductor device comprising:
a substrate;
a lower electrode on the substrate;
a first lower interfacial film on the lower electrode and in contact with the lower electrode;
a dielectric film on the first lower interfacial film;
a second lower interfacial film between the first lower interfacial film and the dielectric film and in contact with the first lower interfacial film;
a first upper interfacial film on the dielectric film;
a second upper interfacial film between the first upper interfacial film and the dielectric film and in contact with the first upper interfacial film; and
an upper electrode on the first upper interfacial film,
wherein the first upper interfacial film is in contact with the upper electrode,
wherein the first lower interfacial film is a conductive single film, the first upper interfacial film is a conductive single film, and the first lower interfacial film and the first upper interfacial film include a same first metal element,
wherein an electronegativity of the same first metal element included in each of the first lower interfacial film and the first upper interfacial film is greater than an electronegativity of a second metal element included in the dielectric film, and wherein the second lower interfacial film is a conductive single film and the second upper interfacial film is a conductive single film, and the second lower interfacial film and the second upper interfacial film include an oxynitride of a third metal element.

2. The device of claim 1, wherein the first lower interfacial film and the first upper interfacial film are a same material.

3. The device of claim 1, wherein a difference between the electronegativity of the same first metal element included in each of the first lower interfacial film and the first upper interfacial film and the electronegativity of the second metal element included in the dielectric film is greater than 0.05.

4. The device of claim 1, wherein the lower electrode and the upper electrode include a same conductive material.

5. The device of claim 1, wherein the lower electrode extends in an elongated manner in a thickness direction of the substrate.

6. The device of claim 1, wherein the lower electrode includes a first extension extending along a top face of the substrate, and a second extension protruding from one end of the first extension and extending in a thickness direction of the substrate.

7. The device of claim 1, wherein each of the first lower interfacial film and the first upper interfacial film includes a nitride of the same first metal element.

8. The device of claim 1, wherein the dielectric film includes at least one of aluminum oxide, zirconium oxide or hafnium oxide.

9. The device of claim 1, wherein the same first metal element included in each of the first lower interfacial film and the first upper interfacial film includes one of niobium (Nb), tantalum (Ta), tin (Sn), zirconium (Zr) and titanium (Ti).

10. A semiconductor device comprising:
a substrate;
a lower electrode on the substrate;
a first lower interfacial film on the lower electrode and in contact with the lower electrode and including a nitride of a first metal element;
a dielectric film on the first lower interfacial film;
a second lower interfacial film between the first lower interfacial film and the dielectric film and in contact with the first lower interfacial film;
a first upper interfacial film on the dielectric film and including the nitride of the first metal element;
an upper electrode on the first upper interfacial film; and
a second upper interfacial film between the first upper interfacial film and the dielectric film and in contact with the first upper interfacial film,
wherein the first upper interfacial film is in contact with the upper electrode,
wherein an electronegativity of the first metal element is greater than an electronegativity of a second metal element included in the dielectric film, and
wherein the second lower interfacial film is a conductive single film and the second upper interfacial film is a conductive single film, and the second lower interfacial film and the second upper interfacial film include an oxynitride of a third metal element.

11. The device of claim 10,
wherein the first metal element and the third metal element are different from each other, and
an electronegativity of the third metal element is greater than the electronegativity of the second metal element included in the dielectric film.

12. The device of claim 10, wherein the dielectric film includes at least one of hafnium (Hf) and zirconium (Zr), and the first metal element of each of the first lower interfacial film and the first upper interfacial film includes at least one of tin (Sn), niobium (Nb) and tantalum (Ta).

13. The device of claim 10, wherein each of the first lower interfacial film and the first upper interfacial film is a single film.

14. A semiconductor device comprising:

a substrate;

the substrate defining a trench;

a gate electrode filling a portion of the trench;

a buried contact on at least one side of the gate electrode and connected to the substrate;

a landing pad on the buried contact; and a capacitor connected to the landing pad, wherein the capacitor includes, a lower electrode on the substrate, a first lower interfacial film on the lower electrode and in contact with the lower electrode, a dielectric film on the lower interfacial film, a second lower interfacial film between the first lower interfacial film and the dielectric film and in contact with the first lower interfacial film, a first upper interfacial film on the dielectric film, a second upper interfacial film between the first upper interfacial film and the dielectric film and in contact with the first upper interfacial film, and an upper electrode on the first upper interfacial film, wherein the first upper interfacial film is in contact with the upper electrode, wherein the upper and lower electrodes include a same conductive material, wherein the first lower interfacial film is a single film and the first upper interfacial film is a single film, and the first lower interfacial film and the first upper interfacial film include a same first metal element, wherein an electronegativity of the same first metal element included in each of the first lower interfacial film and the first upper interfacial film is greater than an electronegativity of a second metal element included in the dielectric film, and wherein the second lower interfacial film is a conductive single film and the second upper interfacial film is a conductive single film, and the second lower interfacial film and the second upper interfacial film include an oxynitride of a third metal element.

15. The device of claim 14, further comprising:

a supporter surrounding a sidewall of the lower electrode and contacting the first lower interfacial film.

16. The device of claim 15, wherein a top face of the lower electrode and a top face of the supporter are coplanar with each other.

17. The device of claim 15, wherein the supporter includes a plurality of supporter patterns spaced apart from each other in a direction perpendicular to a top face of the substrate.

18. The device of claim 14, wherein a difference between the electronegativity of the same first metal element included in each of the first lower interfacial film and the first upper interfacial film and the electronegativity of the second metal element included in the dielectric film is greater than 0.05.

* * * * *